US012181903B2

(12) United States Patent
Koay et al.

(10) Patent No.: US 12,181,903 B2
(45) Date of Patent: Dec. 31, 2024

(54) POWER SUPPLY REJECTION ENHANCER

(71) Applicant: QUALCOMM Incorporated, San Diego, CA (US)

(72) Inventors: Kuan Chuang Koay, Singapore (SG); Hua Guan, San Diego, CA (US); Jize Jiang, Singapore (SG)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/315,402

(22) Filed: May 10, 2023

(65) Prior Publication Data

US 2023/0280773 A1    Sep. 7, 2023

Related U.S. Application Data

(63) Continuation of application No. 17/213,044, filed on Mar. 25, 2021, now Pat. No. 11,687,104.

(51) Int. Cl.
*G05F 1/56* (2006.01)
*H03F 3/16* (2006.01)

(52) U.S. Cl.
CPC ....... *G05F 1/56* (2013.01); *H03F 3/16* (2013.01)

(58) Field of Classification Search
CPC ... G05F 3/18; G05F 3/185; G05F 3/10; G05F 3/16; G05F 3/20; G05F 3/26; G05F 3/00–3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/463; G05F 1/468; G05F 1/46; G05F 1/461; G05F 1/575; G05F 1/465; G05F 1/462; G05F 1/56; G05F 1/562; G05F 1/565; G05F 1/567; G05F 1/569; G05F 1/571; G05F 1/573; G05F 1/5735

See application file for complete search history.

(56) References Cited

U.S. PATENT DOCUMENTS

| | | | |
|---|---|---|---|
| 7,589,507 B2 | 9/2009 | Mandal | |
| 7,919,954 B1 | 4/2011 | Mannama et al. | |
| 8,143,868 B2 | 3/2012 | Dasgupta et al. | |
| 9,285,821 B2 * | 3/2016 | Maeda | G05F 3/262 |

(Continued)

FOREIGN PATENT DOCUMENTS

| | | |
|---|---|---|
| CN | 1989683 A | 6/2007 |
| CN | 101281410 A | 10/2008 |

(Continued)

OTHER PUBLICATIONS

English translation of CN 106777578 (Year: 2017).*

(Continued)

*Primary Examiner* — Thienvu V Tran
*Assistant Examiner* — Nusrat Quddus
(74) *Attorney, Agent, or Firm* — Loza & Loza, LLP

(57) ABSTRACT

In certain aspects, a system includes an amplifying circuit having an input and an output, a high-pass filter coupled between a gate of a pass transistor of a low dropout (LDO) regulator and the input of the amplifying circuit, and a metal-oxide-semiconductor (MOS) capacitor coupled between the output of the amplifying circuit and the gate of the pass transistor.

21 Claims, 14 Drawing Sheets

(56) References Cited

U.S. PATENT DOCUMENTS

| | | |
|---|---|---|
| 9,502,115 B2 | 11/2016 | Conte et al. |
| 9,760,105 B1 | 9/2017 | Wang et al. |
| 9,887,674 B2 | 2/2018 | Ramos et al. |
| 9,933,801 B1 | 4/2018 | Guan et al. |
| 9,946,283 B1 | 4/2018 | Yung et al. |
| 10,152,072 B1 | 12/2018 | Elhebeary et al. |
| 10,175,706 B2 | 1/2019 | Golara et al. |
| 10,254,778 B1 | 4/2019 | Sambucco et al. |
| 10,423,178 B1 | 9/2019 | Chen |
| 10,831,221 B1* | 11/2020 | Tesch .................. G05F 1/575 |
| 11,003,201 B1 | 5/2021 | Ahmed et al. |
| 11,586,235 B2* | 2/2023 | Nagata ................. G05F 3/262 |
| 11,635,778 B2* | 4/2023 | Jiang ................... G05F 1/575 323/280 |
| 11,656,643 B2* | 5/2023 | Delshadpour ......... G05F 1/461 323/280 |
| 11,789,478 B2* | 10/2023 | Deng ................... G05F 1/575 323/280 |
| 11,803,203 B2* | 10/2023 | Maggi .................. G01R 19/10 |
| 11,906,998 B2* | 2/2024 | Agarwal ............... G05F 1/575 |
| 11,940,829 B2* | 3/2024 | Guiraud ............... G05F 1/575 |
| 11,947,373 B2* | 4/2024 | Lin ...................... G05F 1/56 |
| 12,032,397 B2* | 7/2024 | Kao ..................... G05F 1/565 |
| 12,079,022 B2* | 9/2024 | Hashemi ............... G11C 5/147 |
| 2002/0005711 A1 | 1/2002 | Bakker et al. |
| 2005/0184711 A1 | 8/2005 | Chen et al. |
| 2006/0202738 A1* | 9/2006 | Gatta ................... H03K 17/687 327/427 |
| 2007/0159146 A1 | 7/2007 | Mandal |
| 2007/0241731 A1 | 10/2007 | Van Ettinger |
| 2008/0054867 A1 | 3/2008 | Soude et al. |
| 2008/0169795 A1* | 7/2008 | Wang ................... G05F 1/575 323/280 |
| 2009/0001953 A1 | 1/2009 | Huang |
| 2009/0256540 A1 | 10/2009 | Yang et al. |
| 2010/0289472 A1 | 11/2010 | Renous |
| 2011/0012582 A1 | 1/2011 | Aisu |
| 2011/0121802 A1 | 5/2011 | Zhu |
| 2011/0248693 A1 | 10/2011 | Karnik et al. |
| 2012/0049954 A1 | 3/2012 | Wang et al. |
| 2012/0153910 A1* | 6/2012 | Bulzacchelli ........ G05F 1/575 323/272 |
| 2013/0099764 A1 | 4/2013 | Zhang et al. |
| 2013/0113454 A1 | 5/2013 | Chen et al. |
| 2013/0285631 A1 | 10/2013 | Bisson et al. |
| 2014/0002174 A1 | 1/2014 | Guan et al. |
| 2014/0091775 A1 | 4/2014 | Tan et al. |
| 2014/0266103 A1 | 9/2014 | Wang et al. |
| 2015/0022166 A1 | 1/2015 | Bisson et al. |
| 2015/0035513 A1 | 2/2015 | Hinrichs |
| 2015/0198960 A1 | 7/2015 | Zhang et al. |
| 2015/0220094 A1 | 8/2015 | Ho et al. |
| 2016/0195883 A1 | 7/2016 | Aboudina et al. |
| 2016/0291619 A1 | 10/2016 | Guan et al. |
| 2017/0003699 A1* | 1/2017 | Lin ...................... G05F 1/575 |
| 2017/0005552 A1 | 1/2017 | Tsuchiya et al. |
| 2017/0097649 A1 | 4/2017 | Lee et al. |
| 2017/0364111 A1 | 12/2017 | Flaibani et al. |
| 2018/0284829 A1 | 10/2018 | Hussien et al. |
| 2020/0125126 A1 | 4/2020 | Gupta et al. |
| 2020/0272184 A1 | 8/2020 | Petenyi |
| 2021/0089066 A1* | 3/2021 | Sawahara ............. G05F 1/595 |
| 2021/0216092 A1* | 7/2021 | Chang .................. G05F 1/562 |
| 2022/0035393 A1 | 2/2022 | Hafizi |
| 2022/0115999 A1 | 4/2022 | Lien et al. |
| 2022/0206519 A1 | 6/2022 | Phong |
| 2022/0269296 A1* | 8/2022 | Kao ..................... H03F 3/4565 |
| 2022/0308609 A1 | 9/2022 | Koay |
| 2022/0350357 A1 | 11/2022 | Shashwat et al. |
| 2023/0221743 A1* | 7/2023 | Lin ...................... G05F 1/575 323/273 |
| 2023/0221744 A1* | 7/2023 | Pande .................. H02M 3/07 323/234 |
| 2023/0266783 A1* | 8/2023 | Deng ................... G05F 1/467 323/280 |
| 2023/0393601 A1* | 12/2023 | Roh ..................... G05F 1/467 |
| 2024/0295890 A1* | 9/2024 | Lin ...................... G05F 1/575 |

FOREIGN PATENT DOCUMENTS

| | | | | |
|---|---|---|---|---|
| CN | 101931370 A | | 12/2010 | |
| CN | 102200791 A | | 9/2011 | |
| CN | 103677069 A | | 3/2014 | |
| CN | 204314766 U | | 5/2015 | |
| CN | 104821721 A | | 8/2015 | |
| CN | 106444949 A | | 2/2017 | |
| CN | 106774578 A | * | 5/2017 | ............. G05F 1/56 |
| CN | 108919874 A | | 11/2018 | |
| CN | 113568462 A | | 10/2021 | |
| DE | 102019201195 B3 | | 1/2020 | |
| JP | 2005202781 A | | 7/2005 | |
| KR | 20060085166 A | | 7/2006 | |
| KR | 101768064 B1 | | 8/2017 | |
| WO | 2016060556 A1 | | 4/2016 | |
| WO | 2017218141 A1 | | 12/2017 | |

OTHER PUBLICATIONS

International Search Report and Written Opinion—PCT/US2022/019256—ISA/EPO—Jun. 7, 2022.

Yun S.J., et al., "Capless LDO Regulator Achieving-76 dB PSR and 96.3 fs FOM", IEEE Transactions on Circuits and Systems-II: Express Briefs, Oct. 2017, vol. 64, No. 10, pp. 1147-1151.

\* cited by examiner

POWER SUPPLY REJECTION ENHANCER

RELATED APPLICATION

The present application is a continuation of U.S. application Ser. No. 17/213,044, filed on Mar. 25, 2021, the entire specification of which is incorporated herein by reference.

BACKGROUND

Field

Aspects of the present disclosure relate generally to voltage regulation, and more particularly, to enhancing power supply rejection of a voltage regulator.

Background

A voltage regulator may be used to provide a clean regulated voltage to a circuit from a noisy power supply. Power supply rejection (PSR) measures the ability of a voltage regulator to reject power supply noise at the output of the regulator. The higher the PSR, the cleaner the regulated voltage provided to the circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes an amplifying circuit having an input and an output, a high-pass filter coupled between a gate of a pass transistor of a low dropout (LDO) regulator and the input of the amplifying circuit, and a metal-oxide-semiconductor (MOS) capacitor coupled between the output of the amplifying circuit and the gate of the pass transistor.

A second aspect relates to a system. The system includes an amplifying circuit having an input and an output, wherein the input of the amplifying circuit is coupled to a gate of a pass transistor of a low dropout (LDO) regulator, a source of the pass transistor is coupled to a supply rail, and a drain of the pass transistor is coupled to an output of the LDO regulator. The system also includes a metal-oxide-semiconductor (MOS) capacitor coupled between the output of the amplifying circuit and the gate of the pass transistor, and a current-sensing transistor having a gate coupled to the gate of the pass transistor, a source coupled to the supply rail, and a drain coupled to the amplifying circuit.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A voltage regulator may be used to provide a clean regulated voltage to a circuit from a noisy power supply. Power supply rejection (PSR) measures the ability of a voltage regulator to reject power supply noise at the output of the regulator. The higher the PSR, the cleaner the regulated voltage provided to the circuit. For many applications, a high PSR is desired to avoid noise from the power supply being injected into the circuit. For an example where the circuit includes an image-sensing circuit, a high PSR is desirable to prevent power supply noise from reaching the image-sensing circuit, which can result in noticeable white lines in an image captured with the image-sensing circuit.

Figure 1:
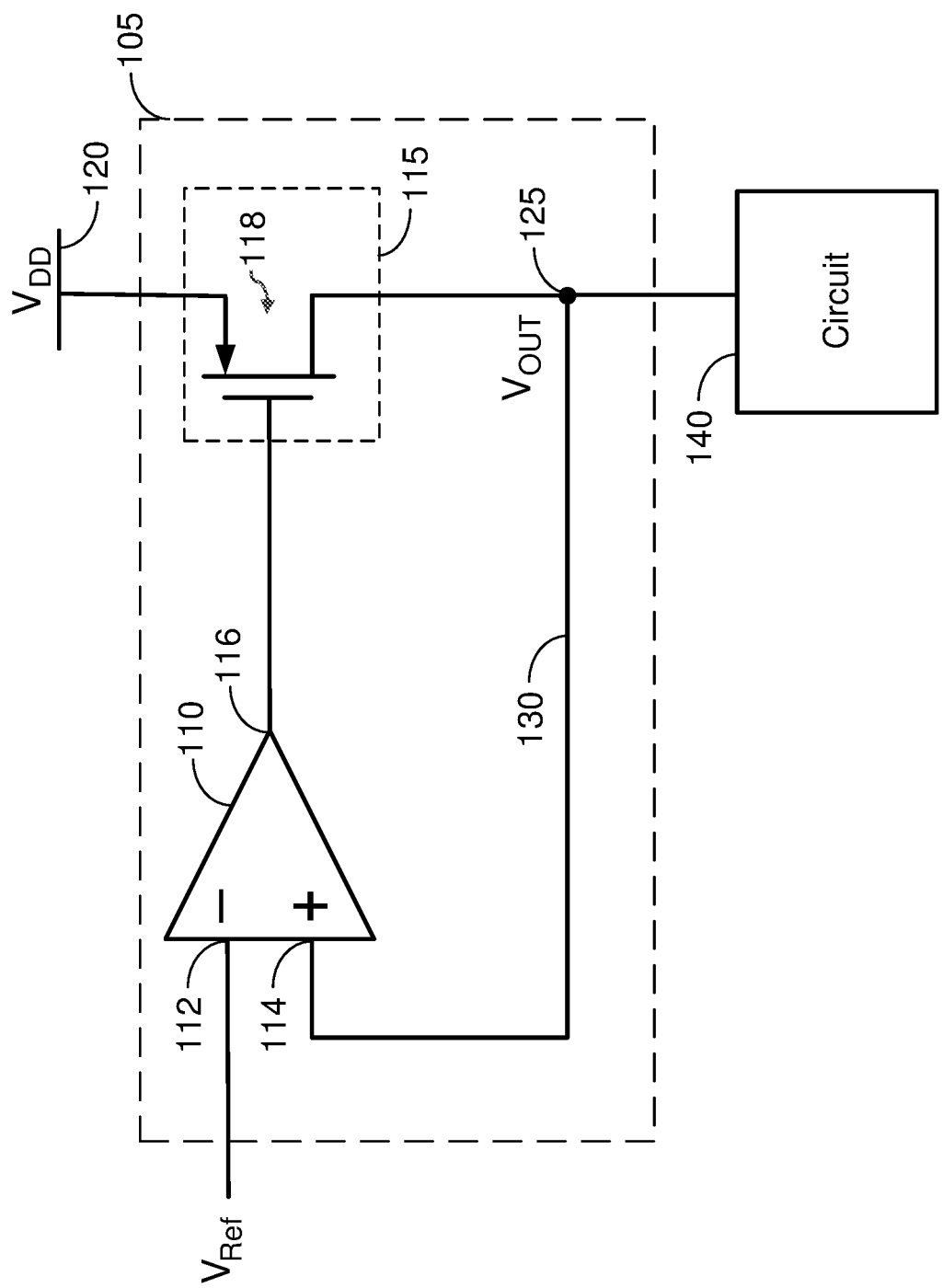
FIG. 1 shows an example of a low-dropout (LDO) regulator according to certain aspects of the present disclosure.

A commonly used voltage regulator is the low-dropout (LDO) regulator. In this regard, FIG. 1 shows an example of an LDO regulator 105 according to certain aspects. The LDO regulator 105 is configured to provide a regulated voltage $V_{OUT}$ to a circuit 140 from a supply voltage $V_{DD}$ on a supply rail 120. The LDO regulator 105 includes a pass transistor 115 coupled between a power supply rail 120 and the circuit 140. In the example in FIG. 1, the pass transistor 115 is implemented with a p-type metal-oxide-semiconductor (PMOS) transistor 118 having a source coupled to the supply rail 120 and a drain coupled to the output 125 of the LDO regulator 105. It is to be appreciated that the pass transistor 115 is not limited to this example, and that the pass transistor 115 may be implemented with another type of transistor. It is also to be appreciated that the pass transistor 115 may be implemented with multiple transistors coupled in parallel.

The LDO regulator 105 also includes an amplifier 110 with an output 116 coupled to the gate of the pass transistor 115, a first input 112 coupled to a reference voltage $V_{REF}$, and a second input 114 coupled to the output 125 of the LDO regulator 105 via a feedback path 130. The reference voltage $V_{REF}$ may be provided by a bandgap voltage reference circuit, a voltage divider, a current source in series with a resistor, and/or another type of circuit. In the example in FIG. 1, the first input 112 is an inverting input and the second input 114 is a non-inverting input.

In operation, the amplifier 110 adjusts the gate voltage of the pass transistor 115 in a direction that reduces the difference (i.e., error) between the reference voltage $V_{REF}$ and the regulated voltage $V_{OUT}$, which forces the regulated voltage $V_{OUT}$ to be approximately equal to the reference voltage $V_{REF}$. Thus, in this example, the regulated voltage $V_{OUT}$ may be set to a desired voltage for the circuit 140 by setting the reference voltage $V_{REF}$ accordingly. It is to be appreciated that, in some implementations, the feedback path 130 may include a voltage divider (not shown) in which the voltage fed back to the second input 114 of the amplifier 110 is proportional to the regulated voltage $V_{OUT}$.

A challenge with the LDO regulator 105 is that supply noise on the supply rail 120 may be coupled to the output 125 of the LDO regulator 105 through parasitic capacitances $C_{gs}$, $C_P$, and $C_{gd}$, where $C_{gs}$ is the gate-to-source capacitance of the pass transistor 115, $C_P$ is parasitic capacitance from the amplifier 110, and $C_{gd}$ is the gate-to-drain capacitance of the pass transistor 115. $C_P$ may also include parasitic capacitance from one or more other elements (not shown) coupled to the gate of the pass transistor 115. The parasitic capacitances $C_{gs}$, $C_P$, and $C_{gd}$ form a capacitive voltage divider at the gate of the pass transistor 115 which results in a small signal gate voltage that can be approximated by the following:

$$v_g \cong \frac{C_{gs}}{C_{gs} + C_p + C_{gd}} v_{dd} \qquad (1)$$

where $v_{dd}$ is the small signal supply voltage due to the supply noise, and $v_g$ is the small signal gate voltage of the pass transistor 115. The supply noise may be generated, for example, by a switching regulator (not shown) coupled to the supply rail 120.

The small signal supply voltage $v_{dd}$ appears at the source of the pass transistor 115, which is coupled to the supply rail 120. Thus, the small signal gate-to-source voltage of the pass transistor 115 is approximately equal to $v_g$ given in equation (1) minus $v_{dd}$, which is non-zero. Because the small signal gate-to-source voltage of the pass transistor 115 is non-zero, the pass transistor 115 generates a small signal current corresponding to the supply noise, which degrades the PSR.

In one approach, PSR is enhanced by canceling the capacitive coupling effect by adding a negative capacitance $C_N$ to the gate of the pass transistor 115 that cancels out the parasitic capacitances $C_P$ and $C_{gd}$. In this approach, the capacitance of the negative capacitance $C_N$ is given by the following:

$$C_N = -(C_p + C_{gd}) \qquad (2).$$

The negative capacitance $C_N$ changes the small signal gate voltage of the pass transistor 115 to the following:

$$v_g \cong \frac{C_{gs}}{C_{gs} + C_p + C_{gd} - (C_p + C_{gd})} v_{dd} = v_{dd}. \qquad (3)$$

Thus, the negative capacitance $C_N$ causes the small signal gate voltage of the pass transistor 115 to be approximately equal to the small signal supply voltage $v_{dd}$ at the source of the pass transistor 115. As a result, the small signal gate-to-source voltage of the pass transistor 115 is approximately zero. This significantly reduces the small signal current generated by the pass transistor 115 corresponding to the supply noise and therefore significantly reduces coupling of the supply noise to the output 125 of the LDO regulator 105.

Figure 2:
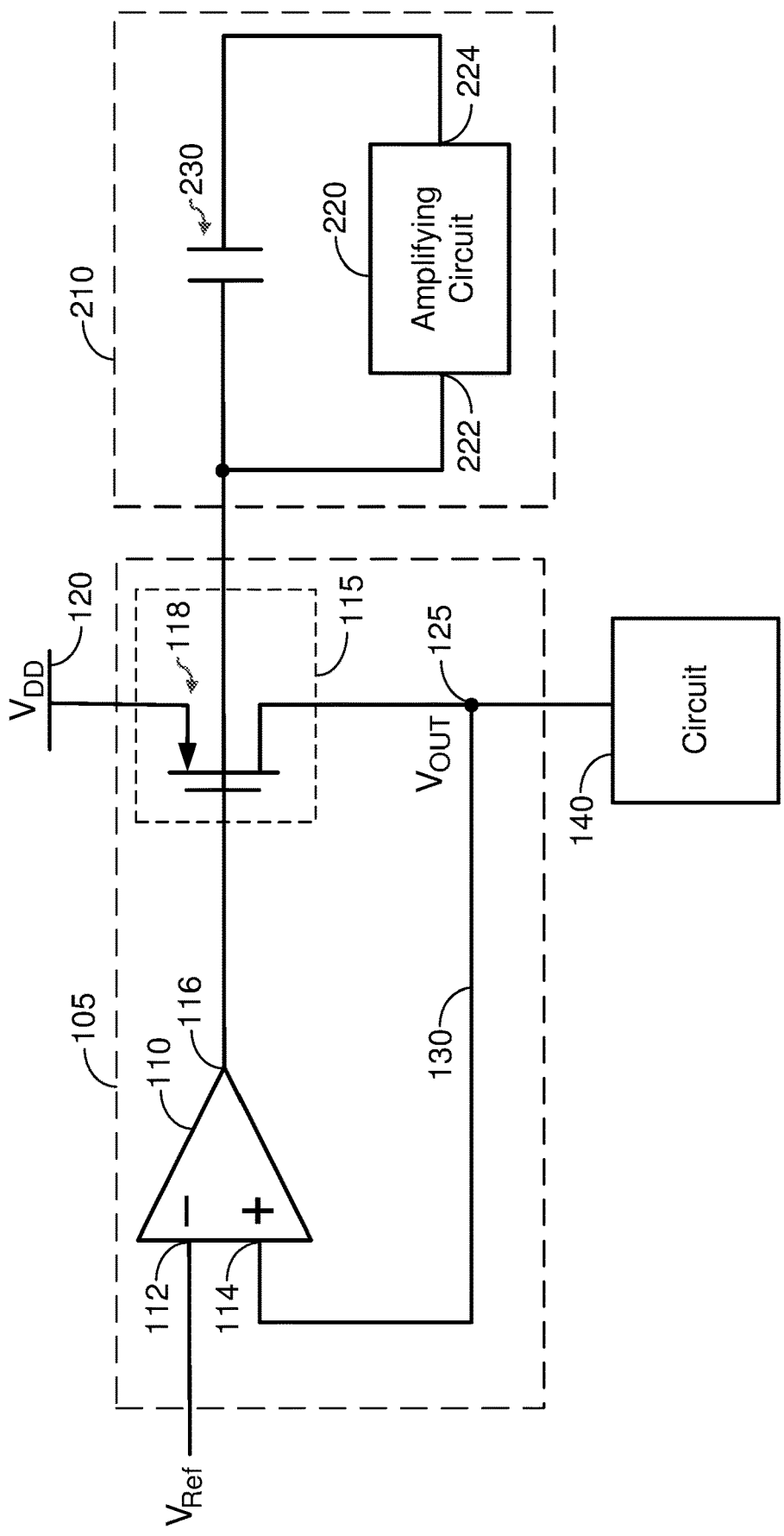
FIG. 2 shows an example of a power supply rejection (PSR) enhancer coupled to the LDO regulator according to certain aspects of the present disclosure.

FIG. 2 shows an example of a PSR enhancer 210 configured to generate the negative capacitance $C_N$. The PSR enhancer 210 includes an amplifying circuit 220 and a capacitor 230. The amplifying circuit 220 has an input 222 and an output 224 in which the input 222 of the amplifying circuit 220 is coupled to the gate of the pass transistor 115, and the capacitor 230 is coupled between the output 224 of the amplifying circuit 220 and the input 222 of the amplifying circuit 220. In this example, the capacitor 230 and the amplifying circuit 220 implement a negative capacitance circuit that generates a negative capacitance $C_N$ given by the following:

$$C_N = C_M(1-G) \qquad (4)$$

where $C_M$ is the capacitance of the capacitor 230 and G is the gain of the amplifying circuit 220. As shown in equation (4), the capacitance $C_N$ is negative, assuming the gain of the amplifying circuit 220 is greater than one. The negative capacitance $C_N$ is coupled to the gate of the pass transistor 115 and cancels the capacitive coupling effect discussed above when the negative capacitance $C_N$ is equal to $-(C_P + C_{gd})$. As shown in equation (4), the negative capacitance $C_N$ can be set approximately equal to $-(C_P + C_{gd})$ by choosing the capacitance $C_M$ of the capacitor 230 and the gain of the amplifying circuit 220 accordingly.

Figure 3:
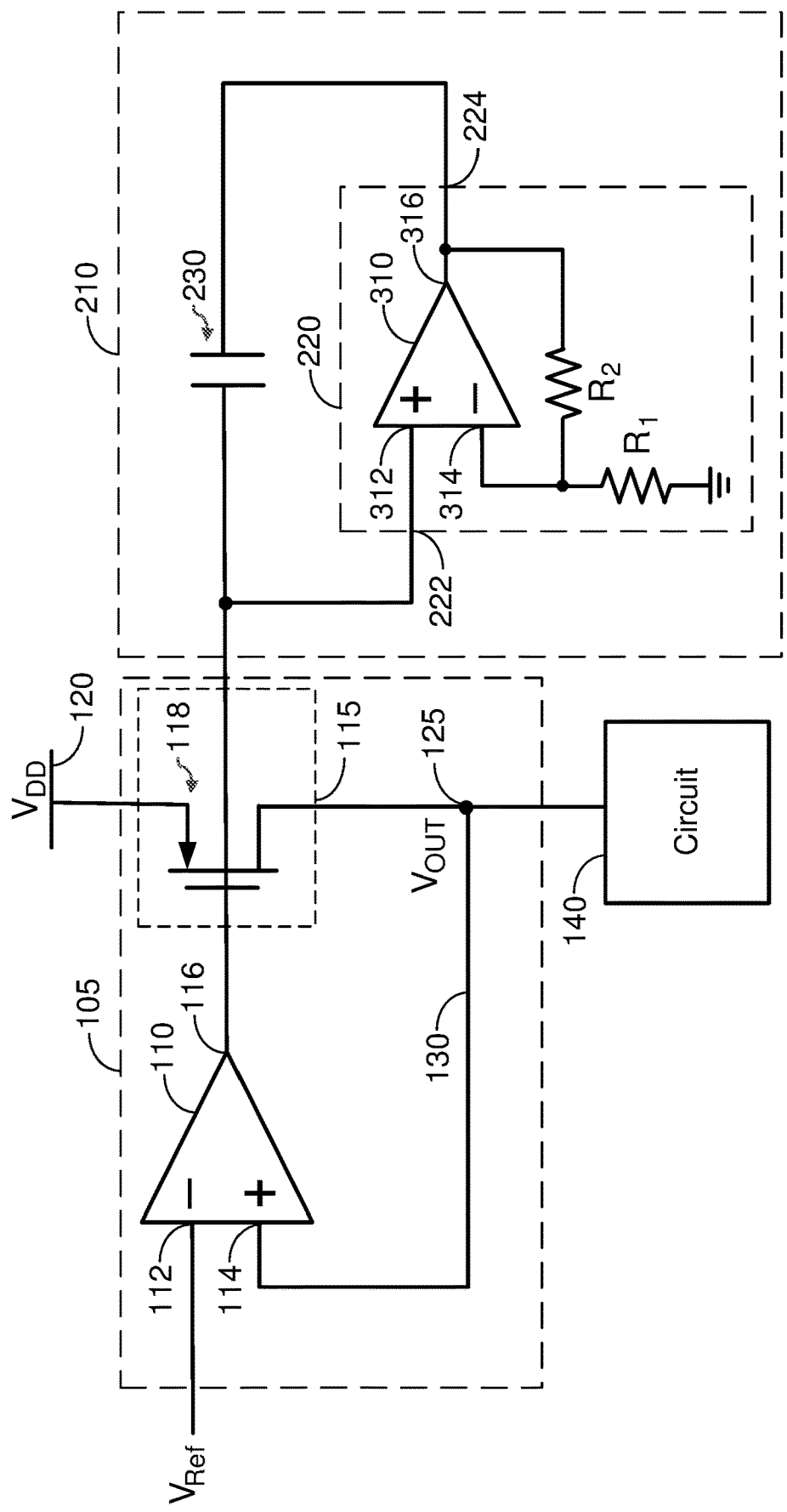
FIG. 3 shows an exemplary implementation of an amplifying circuit in the PSR enhancer according to certain aspects of the present disclosure.

FIG. 3 shows an exemplary implementation of the amplifying circuit 220. In this example, the amplifying circuit 220 includes an amplifier 310 (e.g., an operational amplifier), a first feedback resistor $R_1$, and a second feedback resistor $R_2$. The amplifier 310 has a first input 312, a second input 314, and an output 316. The first input 312 of the amplifier 310 is coupled to the input 222 of the amplifying circuit 220, and the output 316 of the amplifier 310 is coupled to the output 224 of the amplifying circuit 220. The first feedback resistor $R_1$ is coupled between the second input 314 of the amplifier 310 and a ground, and the second feedback resistor $R_2$ is coupled between the output 316 of the amplifier 310 and the second input 314 of the amplifier 310. In the example in FIG. 3, the first input 312 of the amplifier 310 is a non-inverting input and the second input 314 of the amplifier 310 is an inverting input. In operation, the first feedback resistor $R_1$ and the second feedback resistor $R_2$ cause the closed-loop gain of the amplifying circuit 220 to be approximately equal to the following:

$$G = 1 + \frac{R_2}{R_1} \quad (5)$$

where $R_1$ in equation (5) is the resistance of the first feedback resistor $R_1$, and $R_2$ in equation (5) is the resistance of the second feedback resistor $R_2$. Equation (5) assumes that the open-loop gain of the amplifier 310 is much greater (e.g., at least an order of magnitude greater) than the ratio of the resistance of the second feedback resistor $R_2$ over the resistance of the first feedback resistor $R_1$ so that the gain of the amplifying circuit 220 is set by the feedback resistors $R_1$ and $R_2$. In this regard, the amplifier 310 may be implemented with an operational amplifier having a high open-loop gain.

In the example in FIG. 3, the negative capacitance $C_N$ generated by the PSR enhancer 210 is given by the following:

$$C_N = -\frac{R2}{R1} C_M. \quad (6)$$

Thus, in this example, the negative capacitance $C_N$ provided by the PSR enhancer 210 is given by the capacitance $C_M$ of the capacitor 230 multiplied by the ratio $-R_2/R_1$.

The capacitor 230 is typically implemented with a metal-insulator-metal (MIM) capacitor. A drawback of using a MIM capacitor is that the MIM capacitor is structurally different from the pass transistor 115. As a result, the capacitance $C_M$ of the capacitor 230 does not track variations in the parasitic capacitances of the pass transistor 115 across process corners. This makes it difficult to set the negative capacitance $C_N$ equal to $-(C_P+C_{gd})$ across process corners, which degrades the PSR performance of the PSR enhancer 210 across process corners.

Another drawback of the PSR enhancer 210 is that the PSR enhancer 210 may be enabled even when the circuit 140 is not performing a task that requires a high PSR, which reduces power efficiency. For the example where the circuit 140 includes an image-sensing circuit, the circuit 140 may need high PSR during image capture to reduce white lines in the resulting image caused by supply noise. However, the circuit 140 may not need high PSR when the circuit 140 is not capturing an image. In this example, leaving the PSR enhancer 210 enabled when the circuit 140 is not capturing an image wastes power, thereby reducing power efficiency.

In addition, the amplifying circuit 220 in the PSR enhancer 210 uses a constant high bias current to provide high PSR even when the current load on the LDO regulator 105 is low. For example, the current load on the LDO regulator 105 may be low when the circuit 140 is in an inactive or low-power state that does not require a high PSR. In this example, maintaining a high bias current for the amplifying circuit 220 when the load is low (i.e., light) is not necessary, resulting in poor low load power efficiency.

Various aspects of the present disclosure overcome one or more of the above drawbacks of the PSR enhancer 210, as discussed further below.

Figure 4:
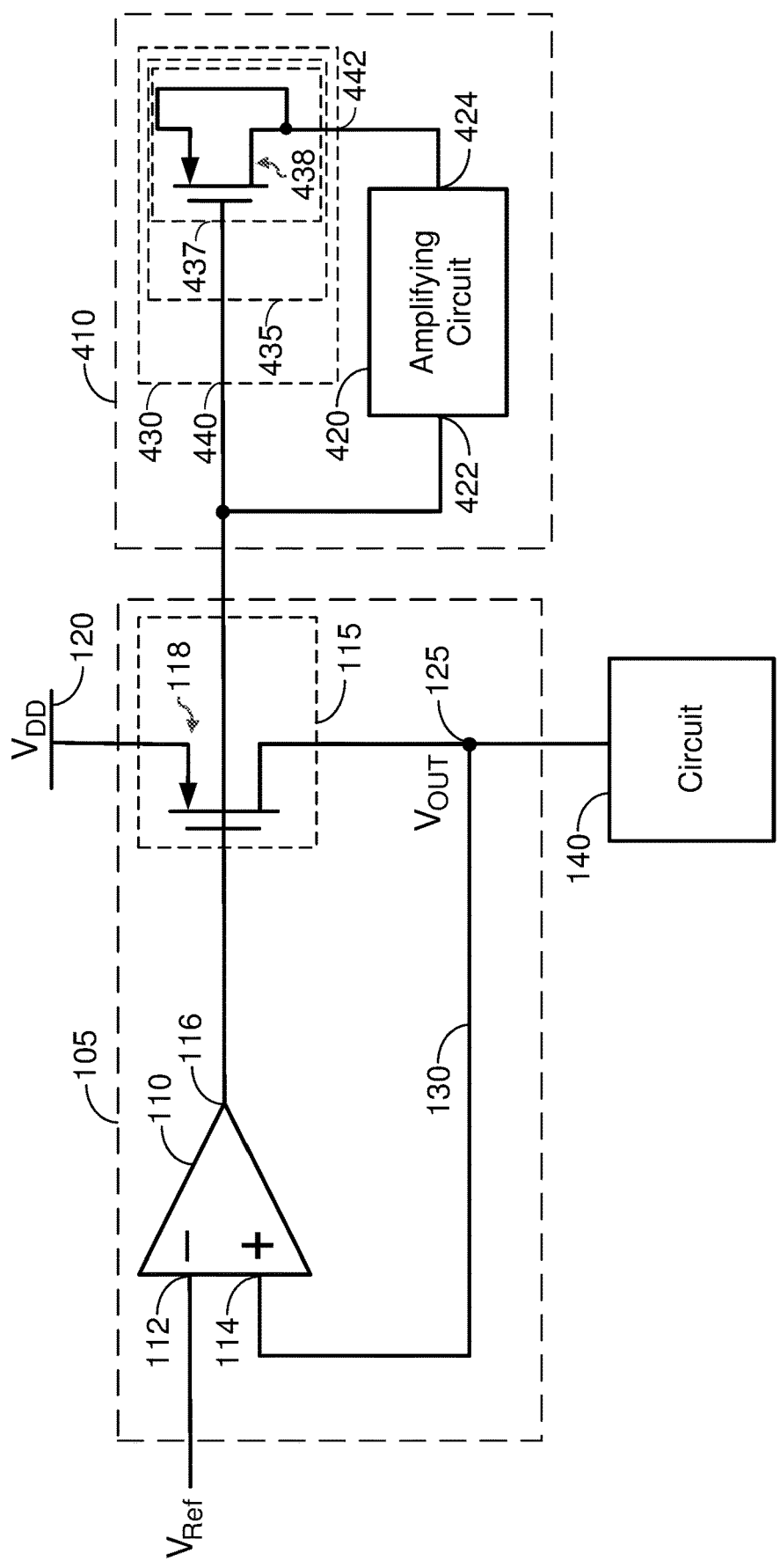
FIG. 4 shows an example of a PSR enhancer including a metal-oxide-semiconductor (MOS) capacitor according to certain aspects of the present disclosure.

FIG. 4 shows an exemplary PSR enhancer 410 according to aspects of the present disclosure. As discussed further below, the PSR enhancer 410 provides a negative capacitance $C_N$ that tracks variations in the parasitic capacitances of the pass transistor 115 across process corners, thereby providing improved PSR performance across process corners.

The PSR enhancer 410 includes an amplifying circuit 420 and a capacitor 430. The amplifying circuit 420 has an input 422 and an output 424 in which the input 422 of the amplifying circuit 420 is coupled to the gate of the pass transistor 115. The capacitor 430 is coupled between the output 424 of the amplifying circuit 420 and the input 422 of the amplifying circuit 420. More particularly, a first terminal 440 of the capacitor 430 is coupled to the input 422 of the amplifying circuit 420 and a second terminal 442 of the capacitor 430 is coupled to the output 424 of the amplifying circuit 420. The input 422 of the amplifying circuit 420 may be a non-inverting input. In this example, the capacitor 430 and the amplifying circuit 420 implement a negative capacitance circuit that generates a negative capacitance $C_N$ given by equation (4) discussed above.

In this example, the capacitor 430 is implemented with a metal-oxide-semiconductor (MOS) capacitor 435, in which the capacitance $C_M$ of the MOS capacitor 435 tracks variations in the parasitic capacitances of the pass transistor 115 across process corners. This property of the MOS capacitor 435 allows the negative capacitance $C_N$ generated by the PSR enhancer 410 to track variations in the parasitic capacitances of the pass transistor 115 across process corners, thereby providing improved PSR performance across process corners.

In this example, the MOS capacitor 435 is implemented with a metal-oxide-semiconductor (MOS) transistor 437. In the example shown in FIG. 4, the pass transistor 115 is implemented with the PMOS transistor 118 and the transistor 437 is implemented with a second PMOS transistor 438, where both transistors 118 and 438 may be integrated on the same chip. However, it is to be appreciated that the pass transistor 115 and the transistor 437 may be implemented with another type of transistor. In one example, the transistor 437 may be fabricated using the same process or substantially the same process as the pass transistor 115 so that the transistor 437 is structurally similar to the pass transistor 115.

In the example in FIG. 4, the source and the drain of the transistor 437 are coupled together to form the MOS capacitor 435. In this example, the gate of the transistor 437 is coupled to the first terminal 440 of the capacitor 430, and the source and the drain of the transistor 437 are coupled to the second terminal 442 of the capacitor 430. In certain aspects, the transistor 437 is proportional to the pass transistor 115, in which the layout of the transistor 437 may be the same or similar to the layout of the pass transistor 115 and the layout of the transistor 437 may be scaled with respect to the layout of the pass transistor 115. Since the transistor 437 forming the MOS capacitor 435 is structurally similar to the pass transistor 115, the capacitance $C_M$ of the MOS capacitor 435 varies in a similar manner as the parasitic capacitances of the pass transistor 115 across process corners. As a result, the capacitance $C_M$ of the MOS capacitor 435 tracks variations in the parasitic capacitances of the pass transistor 115 across process corners. Since the negative capacitance $C_N$ generated by the PSR enhancer 410 is proportional to the capacitance $C_M$ of the MOS capacitor 435, the negative capacitance $C_N$ tracks variations in the parasitic capacitances of the pass transistor 115 across process corners. This allows the negative capacitance $C_N$ to more accurately cancel the capacitive coupling effect across process corners, and thus provide improved PSR performance across process corners.

In contrast, the capacitor 230 in the PSR enhancer 210 shown in FIG. 2 is implemented with a MIM capacitor, which is structurally dissimilar to the pass transistor 115. Therefore, unlike the MOS capacitor 435, the capacitor 230 does not track variations in the parasitic capacitances of the pass transistor 115 across process corners.

In this example, the transistor 437 may be a scaled-down version of the pass transistor 115. In other words, a size of the pass transistor 115 may be a multiple of a size of the transistor 437. This is because the capacitance $C_M$ of the MOS capacitor 435 is multiplied by the amplifying circuit 420 to generate the negative capacitance $C_N$. The larger the gain of the amplifying circuit 420, the smaller the transistor 437 can be relative to the pass transistor 115 to achieve the desired negative capacitance $C_N$.

In one example, the size of the pass transistor 115 may refer to a gate width of the pass transistor 115 and the size of the transistor 437 may refer to a gate width of the transistor 437. In this example, the gate width of the pass transistor 115 may be a multiple of the gate width of the transistor 437. In another example, the size of the pass transistor 115 may refer to a gate area (e.g., gate width times gate length) of the pass transistor 115 and the size of the transistor 437 may refer to a gate area (e.g., gate width times gate length) of the transistor 437. In this example, the gate area of the pass transistor 115 may be a multiple of the gate area of the transistor 437. In certain aspects, the gate of the pass transistor 115 may be physically implemented on a chip with multiple gates (also referred to as gate fingers) that are coupled to one another. In this example, the gate area of the pass transistor 115 may refer to the combined area of the multiple gates constituting the gate of the pass transistor 115. Similarly, the gate of the transistor 437 may be physically implemented on a chip with multiple gates (also referred to as gate fingers) that are coupled to one another. In this example, the gate area of the transistor 437 may refer to the combined area of the multiple gates constituting the gate of the transistor 437.

Figure 5:
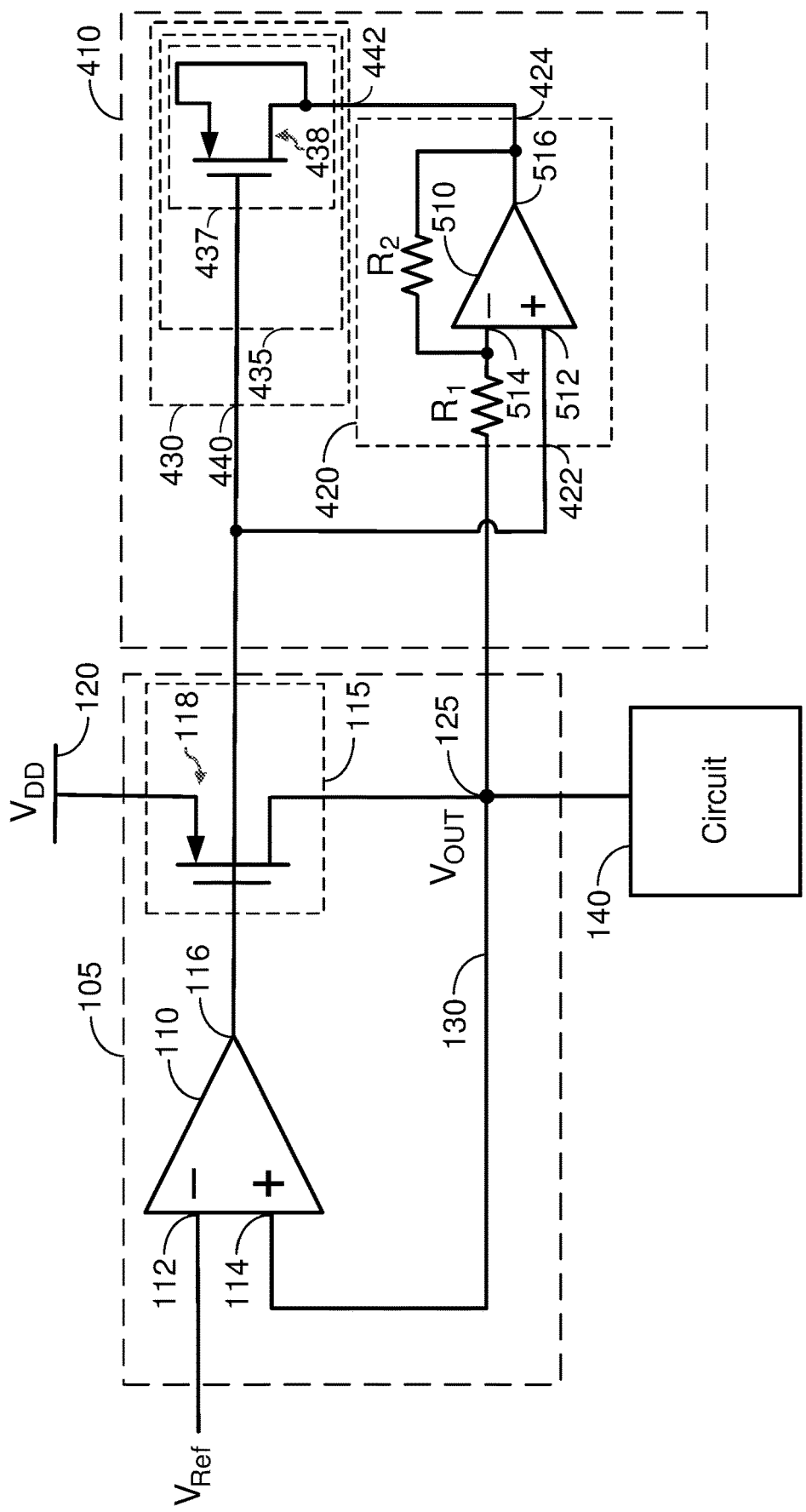
FIG. 5 shows an exemplary implementation of an amplifying circuit according to certain aspects of the present disclosure.

FIG. 5 shows an exemplary implementation of the amplifying circuit 420 according to certain aspects. In this example, the amplifying circuit 420 includes an amplifier 510 (e.g., an operational amplifier), a first feedback resistor $R_1$, and a second feedback resistor $R_2$. The amplifier 510 has a first input 512, a second input 514, and an output 516. The first input 512 of the amplifier 510 is coupled to the input 422 of the amplifying circuit 420, and the output 516 of the amplifier 510 is coupled to the output 424 of the amplifying circuit 420. The first feedback resistor $R_1$ is coupled between the second input 514 of the amplifier 510 and the output 125 of the LDO regulator 105, and the second feedback resistor $R_2$ is coupled between the output 516 of the amplifier 510 and the second input 514 of the amplifier 510. In the example in FIG. 5, the first input 512 of the amplifier 510 is a non-inverting input and the second input 514 of the amplifier 510 is an inverting input.

In operation, the first feedback resistor $R_1$ and the second feedback resistor $R_2$ cause the closed-loop gain of the amplifying circuit 420 to be approximately equal to the gain in equation (5) given above. This assumes that the open-loop gain of the amplifier 310 is much greater (e.g., at least an order of magnitude greater) than the ratio of the resistance of the second feedback resistor $R_2$ over the resistance of the first feedback resistor $R_1$. In this example, the negative capacitance $C_N$ generated by the PSR enhancer 410 is given by the capacitance $C_M$ of the capacitor 430 multiplied by the ratio $-R_2/R_1$.

As discussed above, the transistor 437 implementing the MOS capacitor 435 may be a scaled-down version of the pass transistor 115 since the capacitance $C_M$ of the MOS capacitor 435 is multiplied by the amplifying circuit 420 to generate the negative capacitance $C_N$. In the example in FIG. 5, the size ratio of the transistor 437 to the pass transistor 115 may be 1: K where K is given by the ratio $R_2/R_1$. The larger the ratio $R_2/R_1$, the smaller the transistor 437 can be relative to the pass transistor 115 to achieve the desired negative capacitance $C_N$. In this example, the size of a transistor may refer to a gate width of the transistor, a gate area of the transistor, or the size of another feature of the transistor.

In certain aspects, the capacitive coupling effect may have less impact on PSR at low frequencies (e.g., frequencies below 10 kilohertz). For example, supply noise that is to be rejected by the PSR enhancer 410 may be generated by a switching regulator (not shown) coupled to the supply rail 120 that produces supply noise in the frequency range of tens of kilohertz to ten or more megahertz. In this example, the capacitive coupling effect may not come into play at frequencies below 10 kilohertz. Thus, the PSR enhancer 410 may not need to enhance (i.e., boost) PSR at low frequencies (e.g., frequencies below 10 kilohertz).

Figure 6:
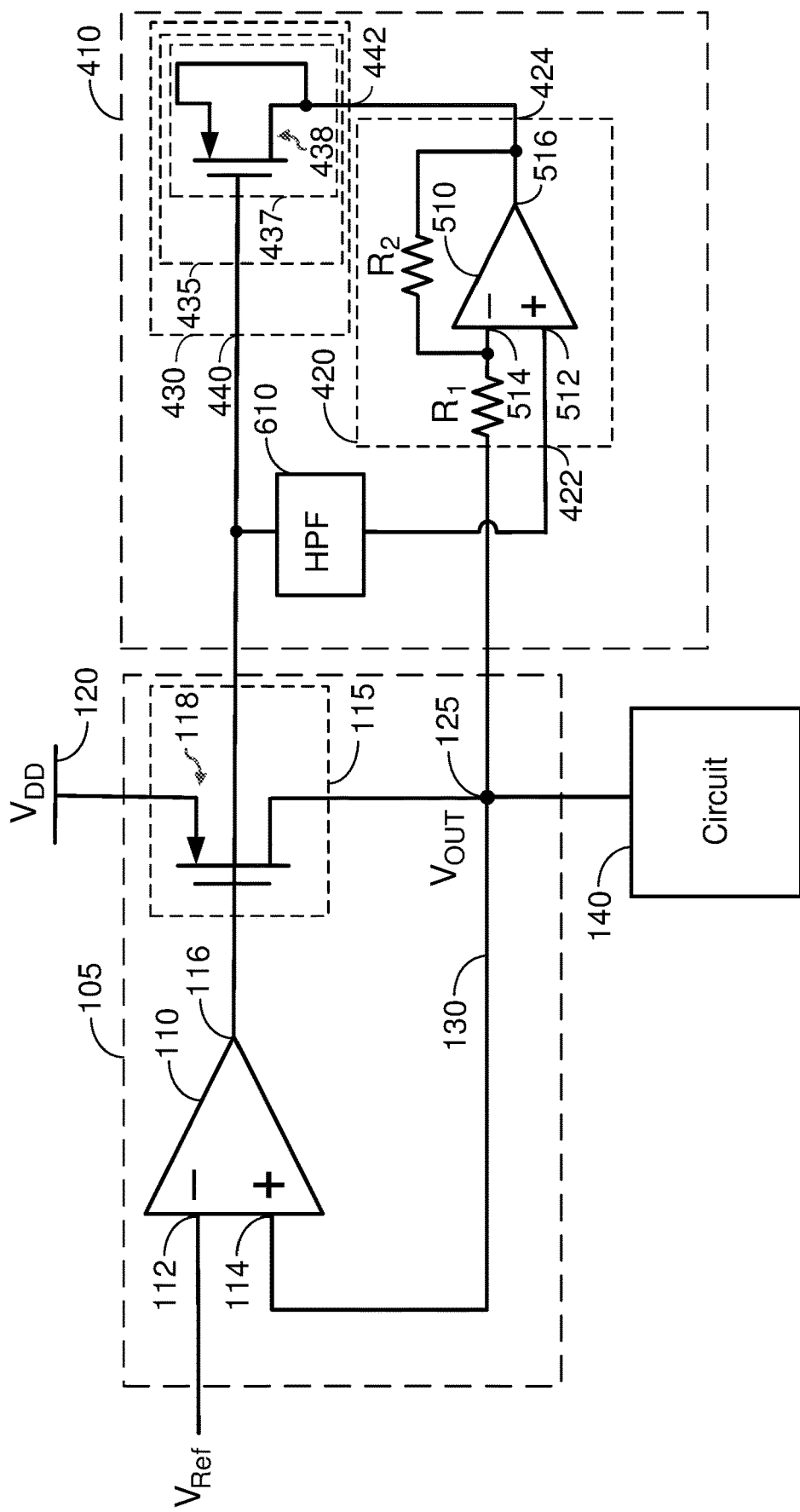
FIG. 6 shows an example of a PSR enhancer including a high-pass filter according to certain aspects of the present disclosure.

In this regard, the PSR enhancer 410 may include a high-pass filter 610 configured to couple the gate voltage of the pass transistor 115 to the input 422 of the amplifying circuit 420 at higher frequencies where PSR enhancement is desired, an example of which is shown in FIG. 6. In the example in FIG. 6, the high-pass filter 610 is coupled between the gate of the pass transistor 115 and the input 422 of the amplifying circuit 420. In other words, the input 422 of the amplifying circuit 420 is coupled to the gate of the pass transistor 115 through the high-pass filter 610. In this example, the corner frequency of the high-pass filter 610 may be set such that the high-pass filter 610 passes the gate voltage at frequencies where PSR enhancement is desirable while rejecting the gate voltage at lower frequencies (e.g., frequencies below 10 kilohertz). In one example, the high-pass filter 610 may have a corner frequency of ten kilohertz or higher.

Thus, in this example, the PSR enhancer 410 enhances (i.e., boosts) PSR at frequencies above the corner frequency of the high-pass filter 610. The output 125 of the LDO regulator 105 may appear as an AC ground at frequencies at which the PSR enhancer 410 enhances PSR.

Figure 7:
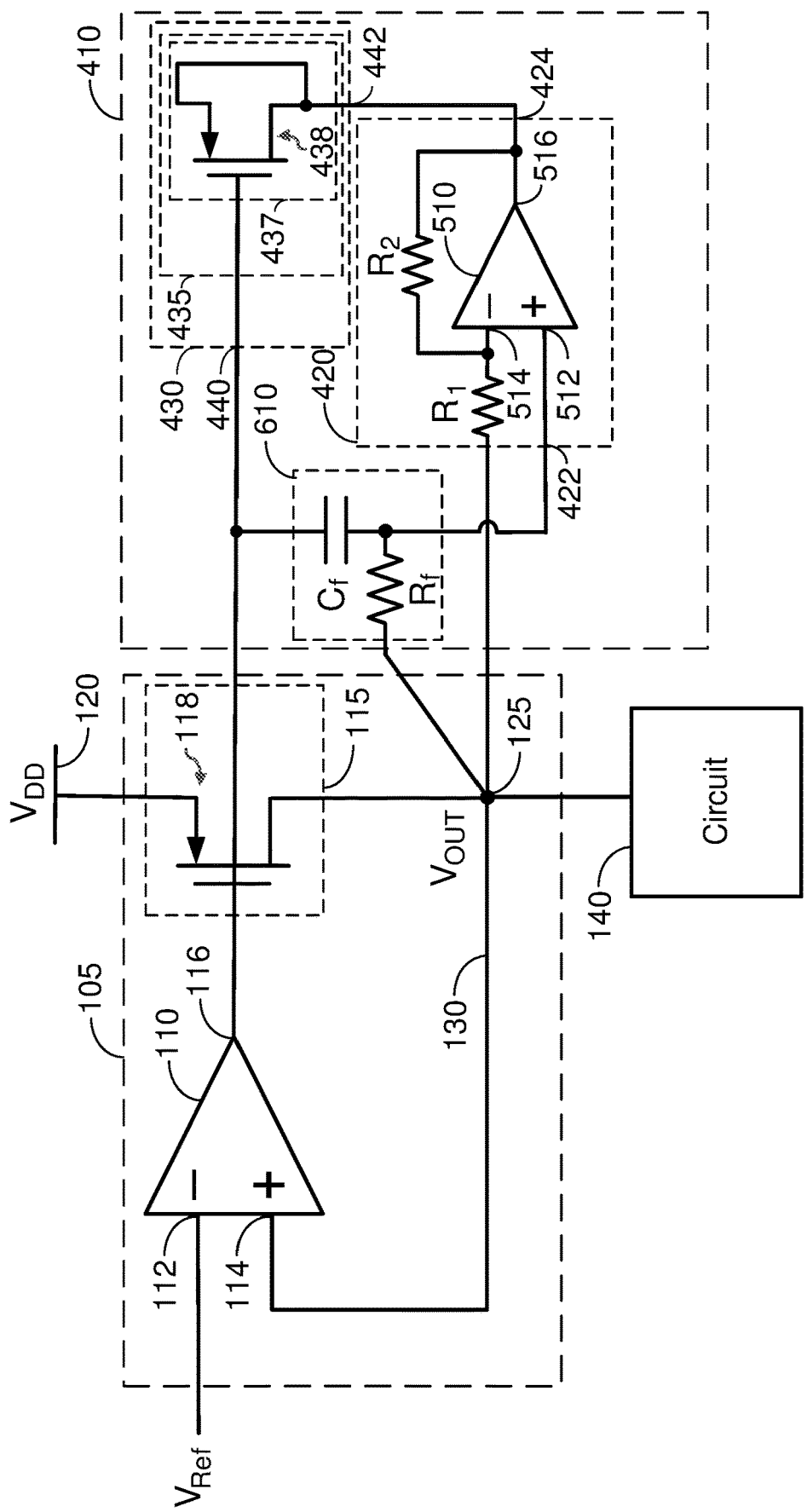
FIG. 7 shows an exemplary implementation of the high-pass filter according to certain aspects of the present disclosure.

FIG. 7 shows an exemplary implementation of the high-pass filter 610 according to certain aspects. In this example, the high-pass filter 610 includes a capacitor $C_f$ coupled between the gate of the pass transistor 115 and the input 422 of the amplifying circuit 420, and a resistor $R_f$ coupled between the input 422 of the amplifying circuit 420 and the output 125 of the LDO regulator 105. In this example, the corner frequency of the high-pass filter 610 is inversely proportional to the product of the resistance of the resistor $R_f$ and the capacitance of the capacitor $C_f$. The resistance of the resistor $R_f$ and the capacitance of the capacitor $C_f$ may be chosen to achieve a desired corner frequency for the high-pass filter 610. It is to be appreciated that the high-pass filter 610 is not limited to the exemplary implementation illustrated in FIG. 7, and that other implementations of the high-pass filter 610 are also applicable.

In certain aspects, the capacitance of capacitor $C_f$ of the high-pass filter 610 may be chosen to be much smaller than the output capacitance of the LDO regulator 105. This is because the capacitor $C_f$, the resistor $R_f$, and the output capacitance may form an impedance divider that degrades PSR. This PSR degradation can be significantly reduced by making the capacitor $C_f$ much smaller than the output capacitance. For example, if the output capacitance is approximately one microfarad, then the capacitance of capacitor $C_f$ may be on the order of a few picofarads to avoid PSR degradation due to the impedance divider.

Figure 8:
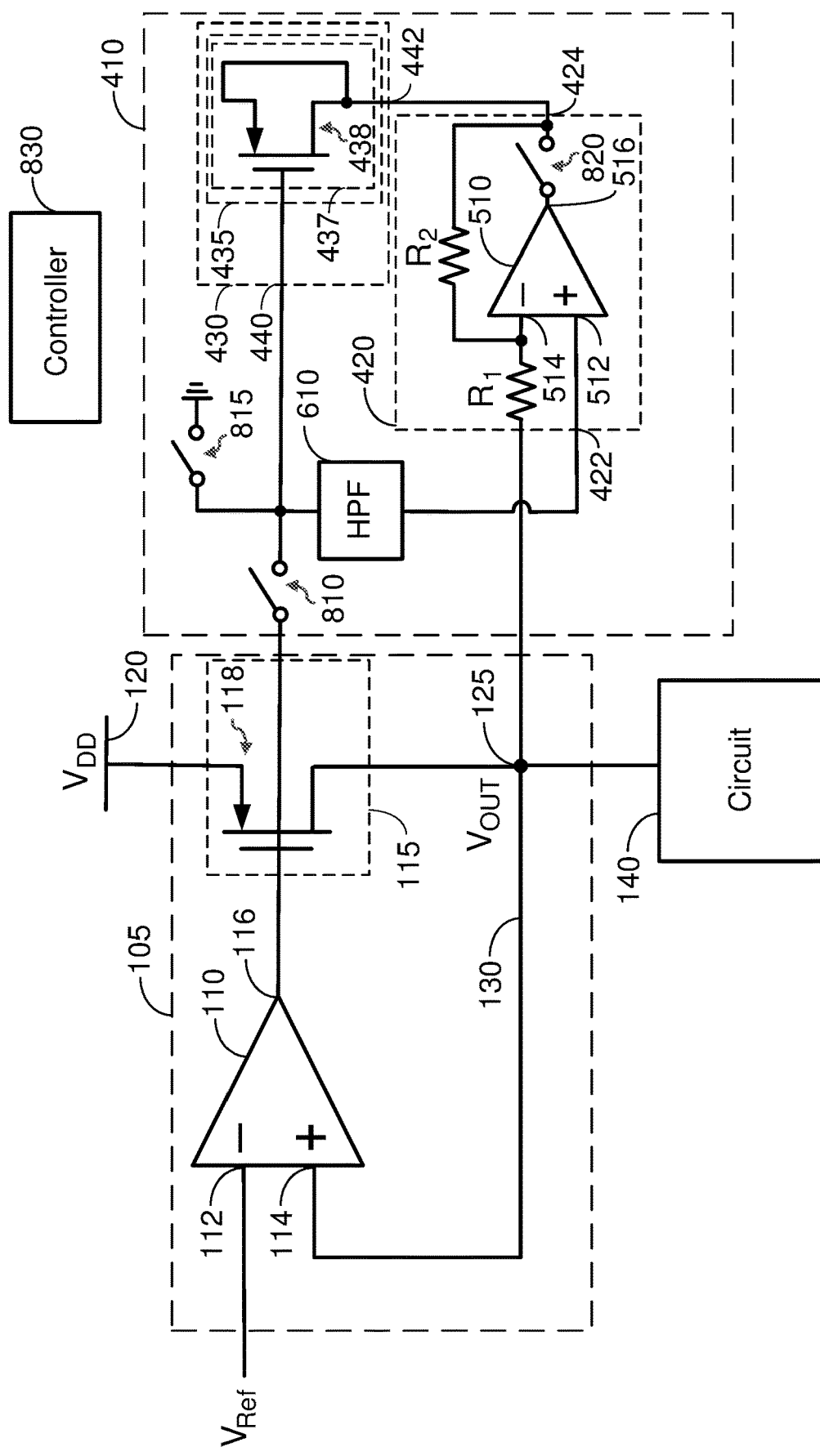
FIG. 8 shows an example of a PSR enhancer including switches according to certain aspects of the present disclosure.

In certain aspects, the PSR enhancer 410 may be disabled when the circuit 140 is not performing a task that requires a high PSR to improve power efficiency. In this regard, FIG. 8 shows an example in which the PSR enhancer 410 includes switches for selectively enabling or disabling the PSR enhancer 410. In this example, the switches include a first switch 810, a second switch 815, and a third switch 820. The first switch 810 is coupled between the gate of the pass transistor 115 and the first terminal 440 of the capacitor 430, the second switch 815 is coupled between the first terminal 440 of the capacitor 430 and ground, and the third switch 820 is coupled between the output 516 of the amplifier 510 (e.g., operational amplifier) and the output 424 of the amplifying circuit 420. Each of the switches 810, 815, and 820 may be implemented with a PMOS transistor, an n-type metal-oxide-semiconductor (NMOS) transistor, a transmission gate, or another type of switch.

In this example, a controller 830 is configured to selectively enable or disable the PSR enhancer 410 by controlling the on/off states of the switches 810, 815, and 820. Note that the individual connections between the controller 830 and the switches 810, 815, and 820 are not explicitly shown in FIG. 8 for ease of illustration. To enable the PSR enhancer 410, the controller 830 turns on (i.e., closes) the first switch 810 and the third switch 820, and turns off (i.e., opens) the second switch 815. To disable the PSR enhancer 410, the controller 830 turns off the first switch 810 and the third switch 820, and turns on the second switch 815. Turning off the first switch 810 decouples the PSR enhancer 410 from the gate of the pass transistor 115, and turning off the third switch 820 decouples the output 516 of the amplifier 510 from the capacitor 430 and the second feedback resistor $R_2$.

In this example, the controller 830 may be configured to enable the PSR enhancer 410 when the circuit 140 is preforming a task where a high PSR is desirable and disable the circuit 140 when the circuit 140 is not performing a task requiring a high PSR to conserve power. For the example where the circuit 140 includes an image-sensing circuit, the controller 830 may enable the PSR enhancer 410 when the image-sensing circuit is capturing an image to reduce image artifacts caused by supply noise. The controller 830 may disable the PSR enhancer 410 when the image-sensing circuit is not capturing an image (e.g., the image-sensing circuit is in a stand-by mode).

It is to be appreciated that the second switch 815 may be omitted from the PSR enhancer 410 in some implementations. In these implementations, the first terminal 440 of the capacitor 430 may be floating when the controller 830 decouples the PSR enhancer 410 from the pass transistor 115 by turning off the first switch 810. It is also to be appreciated that the switches 810, 815, and 820 are not limited to the example in which the capacitor 430 is implemented with the MOS capacitor 435, and that the switches 810, 815, and 820 may be used to selectively enable/disable the PSR enhancer 410 to conserve power in other examples in which the capacitor 430 is implemented with a different type of capacitor.

As discussed above, the amplifying circuit 220 in the PSR enhancer 210 uses a constant high bias current to provide high PSR even when the current load on the LDO regulator 105 is low. This is because a constant current source is used to provide the bias current for the amplifying circuit 220. The high constant bias current leads to poor power efficiency when the current load on the LDO regulator 105 is low, which may occur when the circuit 140 is in an inactive or low-power state that does not require a high PSR.

Figure 9:
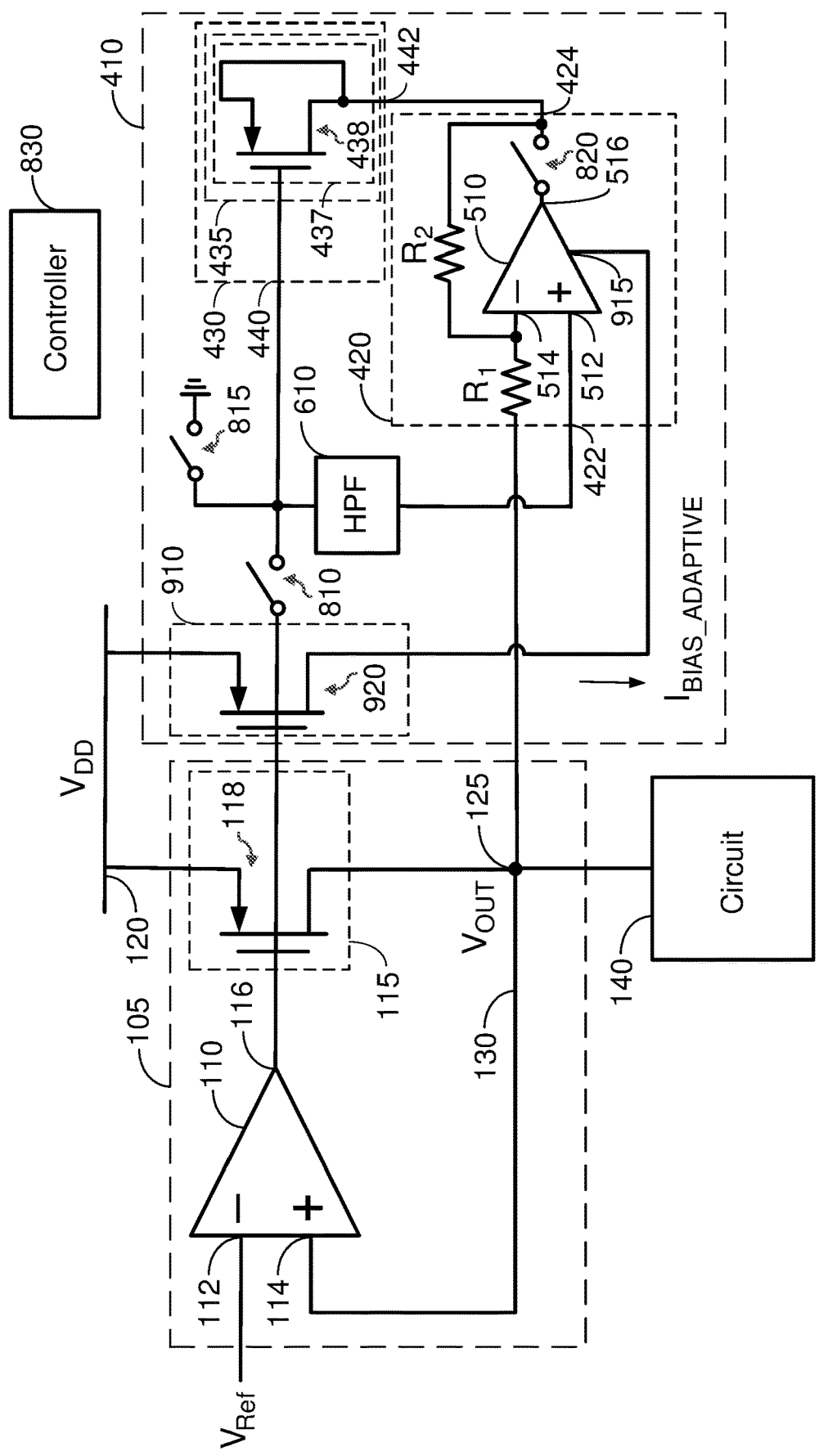
FIG. 9 shows an example of a PSR enhancer with adaptive current biasing according to certain aspects of the present disclosure.

FIG. 9 shows an example in which the PSR enhancer 410 includes adaptive current biasing for the amplifying circuit 420 to increase low load power efficiency. In this example, the PSR enhancer 410 includes a current-sensing transistor 910 configured to provide the amplifying circuit 420 with an adaptive bias current based on the current load. The gate of the current-sensing transistor 910 is coupled to the gate of the pass transistor 115. This causes the current-sensing transistor 910 to provide a bias current that is proportional to the current flowing through the pass transistor 115 and hence the current load on the LDO regulator 105. As a result, the current-sensing transistor 910 is able to sense the current load (i.e., current flowing through the pass transistor 115) and reduce the bias current to the amplifying circuit 420 when the current load is low, thereby increasing low load power efficiency. In contrast, the bias current of the amplifying circuit 220 in FIG. 2 is constantly high even when the current load is low.

In the example in FIG. 9, the current-sensing transistor 910 is implemented with a PMOS transistor 920 having a source coupled to the supply rail 120 and a drain coupled to a bias-current input 915 of the amplifier 510. However, it is to be appreciated that the current-sensing transistor 910 may be implemented with another type of transistor. In this example, the size (e.g., gate width) of the current-sensing transistor 910 may be chosen such that the current-sensing transistor 910 provides the amplifier 510 with sufficient bias current for high gain at nominal current loads. A nominal current load corresponds to a current drawn by the circuit 140 when the circuit 140 is performing a task where high PSR is desirable (e.g., image capture for the example of an image-sensing circuit).

Thus, the current-sensing transistor 910 reduces the bias current to the amplifier 510 when the current load is low resulting in improved low load power efficiency. The reduced bias current reduces the open-loop gain of the amplifier 510 which reduces the performance of the PSR enhancer 410. However, the current load may be low when the circuit 140 is inactive or in a low-power state where high PSR performance is not needed. Thus, in this example, the current-sensing transistor 910 reduces the bias current during a low current load condition that does not require a high PSR.

It is to be appreciated that the current-sensing transistor 910 is not limited to the example in which the capacitor 430 is implemented with the MOS capacitor 435, and that the current-sensing transistor 910 may be used to increase low load power efficiency in other examples in which the capacitor 430 is implemented with a different type of capacitor.

Figure 10:
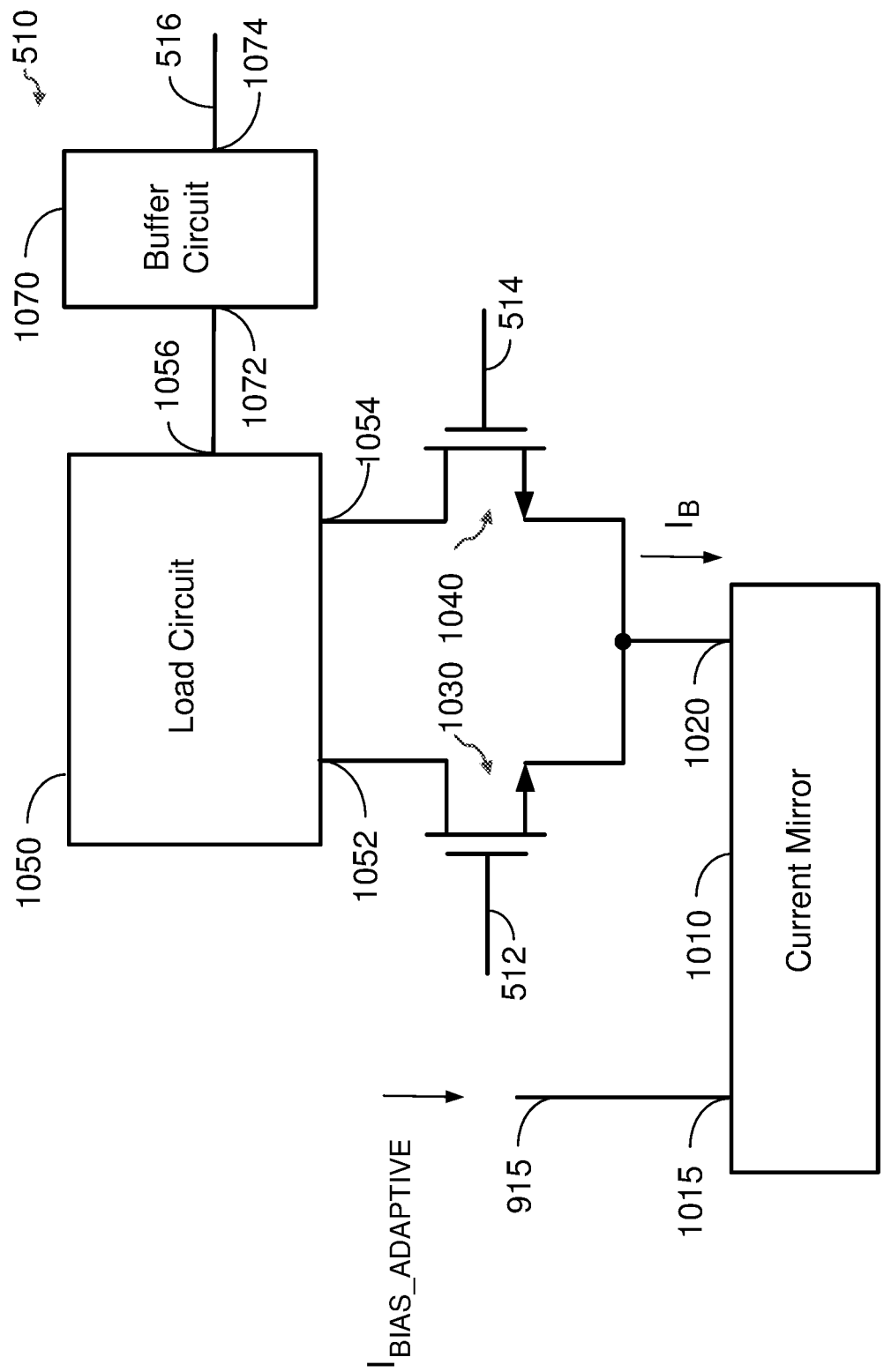
FIG. 10 shows an exemplary implementation of an amplifier in the amplifying circuit according to certain aspects of the present disclosure.

FIG. 10 shows an exemplary implementation of the amplifier 510 according to certain aspects. In this example, the amplifier 510 includes a current mirror 1010, a first input transistor 1030, a second input transistor 1040, a load circuit 1050, and a voltage buffer circuit 1070.

The current mirror 1010 has a first terminal 1015 and a second terminal 1020. The current mirror 1010 is configured to mirror the current flowing into the first terminal 1015 at the second terminal 1020. In this example, the first terminal 1015 of the current mirror 1010 is coupled to the bias-current input 915 of the amplifier 510, and is therefore configured to receive the bias current from the current-sensing transistor 910 (shown in FIG. 9). The current mirror 1010 provides a bias current (labeled "$I_B$") at the second terminal 1020 based on the bias current flowing into the first terminal 1015. For example, the bias current at the second terminal 1020 may be equal to or proportional to the bias current flowing into the first terminal 1015. The current mirror 1010 may be implemented with any one of a number of current mirrors known in the art.

The first input transistor 1030 is coupled between a first terminal 1052 of the load circuit 1050 and the second terminal 1020 of the current mirror 1010. The gate of the first input transistor 1030 is coupled to the first input 512 of the amplifier 510. In the example in FIG. 10, the first input transistor 1030 is implemented with an NMOS transistor having a drain coupled to the first terminal 1052 of the load circuit 1050 and a source coupled to the second terminal 1020 of the current mirror 1010. However, it is to be appreciated that the first input transistor 1030 may also be implemented with a PMOS transistor.

The second input transistor 1040 is coupled between a second terminal 1054 of the load circuit 1050 and the second terminal 1020 of the current mirror 1010. The gate of the second input transistor 1040 is coupled to the second input 514 of the amplifier 510. In the example in FIG. 10, the second input transistor 1040 is implemented with an NMOS transistor having a drain coupled to the second terminal 1054 of the load circuit 1050 and a source coupled to the second terminal 1020 of the current mirror 1010. However, it is to be appreciated that the second input transistor 1040 may also be implemented with a PMOS transistor.

In this example, the bias current provided by the second terminal 1020 of the current mirror 1010 is used to bias the first input transistor 1030 and the second input transistor 1040. As discussed above, the bias current at the second terminal 1020 may be equal to or proportional to the bias current flowing into the first terminal 1015 from the current-sensing transistor 910. Thus, in this example, the bias current used to bias the first input transistor 1030 and the second input transistor 1040 is low when the current-sensing transistor 910 senses a low load on the LDO regulator 105, which increases low load power efficiency. In contrast, the input transistors in the amplifier 310 in FIG. 3 are biased by a constant current source that provides a constant bias current regardless of the current load on the LDO regulator 105.

The load circuit 1050 has an output 1056 coupled to an input 1072 of the voltage buffer circuit 1070. The load circuit 1050 may be implemented with an active load including a current mirror, a cascode current mirror, a folded cascode current mirror, or another type of active load capable of providing high open-loop gain. The voltage buffer circuit 1070 has an output 1074 coupled to the output 516 of the amplifier 510. The voltage buffer circuit 1070 may be configured to convert a high output impedance at the output 1056 of the load circuit 1050 into a low output impedance at the output 516 of the amplifier 510 (e.g., for driving the capacitor 430 and the second resistor $R_2$ with current). The voltage buffer circuit 1070 may be implemented with a source follower amplifier or another type of voltage buffer circuit. It is to be appreciated that the voltage buffer circuit 1070 may be omitted in some implementations.

In operation, the first input transistor 1030 drives the first terminal 1052 of the load circuit 1050 with a first drive current based on the voltage at the first input 512, and the second input transistor 1040 drives the second terminal 1054 of the load circuit 1050 with a second drive current based on the voltage at the second input 514. This generates an output voltage at the output 1056 of the load circuit 1050 with an open-loop gain that is a function of the transconductance of the first and second input transistors 1030 and 1040 and the output impedance of the load circuit 1050. For example, the load circuit 1050 may be implemented with a cascode current mirror (which has a high output impedance) to provide a high open-loop gain.

Figure 11:
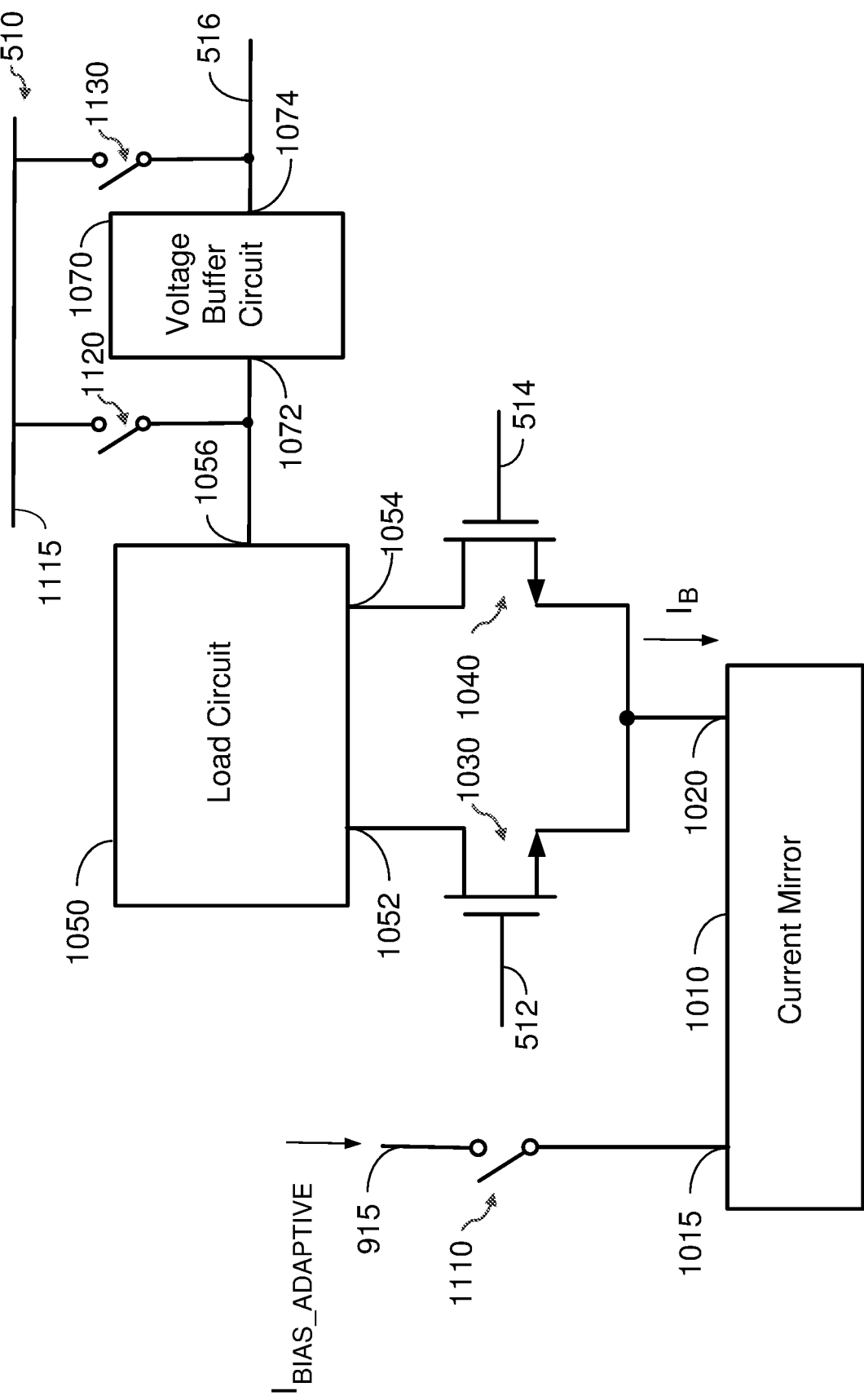
FIG. 11 shows an example in which the amplifier includes switches according to certain aspects of the present disclosure.

FIG. 11 shows an example in which the amplifier 510 include switches for selectively enabling or disabling the amplifier 510 according to certain aspects. In this example, the switches include a first switch 1110, a second switch 1120, and a third switch 1130. The first switch 1110 is coupled between the bias-current input 915 and the first terminal 1015 of the current mirror 1010. In other words, the first switch 1110 is coupled between the current-sensing transistor 910 (shown in FIG. 9) and the first terminal 1015 of the current mirror 1010. The second switch 1120 is coupled between a supply rail 1115 and the output 1056 of the load circuit 1050, and the third switch 1130 is coupled between the supply rail 1115 and the output 1074 of the voltage buffer circuit 1070. The supply rail 1115 may be the same as supply rail 120 or a different supply rail. Each of the switches 1110, 1120, and 1130 may be implemented with a PMOS transistor, an n-type metal-oxide-semiconductor (NMOS) transistor, a transmission gate, or another type of switch.

In this example, the controller 830 (shown in FIG. 8) is configured to selectively enable or disable the amplifier 510 by controlling the on/off states of the switches 1110, 1120, and 1130. Note that the individual connections between the controller 830 and the switches 1110, 1120, and 1130 are not explicitly shown in FIG. 11. To enable the amplifier 510, the controller 830 turns on (i.e., closes) the first switch 1110 and turns off the second switch 1120 and the third switch 1130. To disable the amplifier 510, the controller 830 turns off the first switch 1110 and turns on the second switch 1120 and the third switch 1130. Turning off the first switch 1110 decouples the first terminal 1015 from the current-sensing transistor 910, and therefore cuts off the bias current from the current-sensing transistor 910. Turning on the second switch 1120 pulls the output 1056 of the load circuit 1050 to the supply rail 1115, and turning on the third switch 1130 pulls the output 1074 of the voltage buffer circuit 1070 to the supply rail 1115. In this example, the controller 830 may be configured to enable the amplifier 510 when the circuit 140 is preforming a task where a high PSR is desirable (e.g., image capture) and disable the circuit 140 when the circuit 140 is not performing a task requiring a high PSR to conserve power.

It is to be appreciated that the amplifier 510 may also include switches (not shown) for selectively enabling or disabling individual transistors (not shown) in the load circuit 1050 and the current mirror 1010. For example, for a PMOS transistor, the amplifier 510 may include a switch coupled between the gate of the PMOS transistor and the supply rail 1115 in which the controller 830 turns off the switch to enable the PMOS transistor and turns on the switch to disable the PMOS transistor. For an NMOS transistor, the amplifier 510 may include a switch coupled between the gate of the NMOS transistor and ground in which the controller 830 turns off the switch to enable the NMOS transistor and turns on the switch to disable the NMOS transistor.

Figure 12:
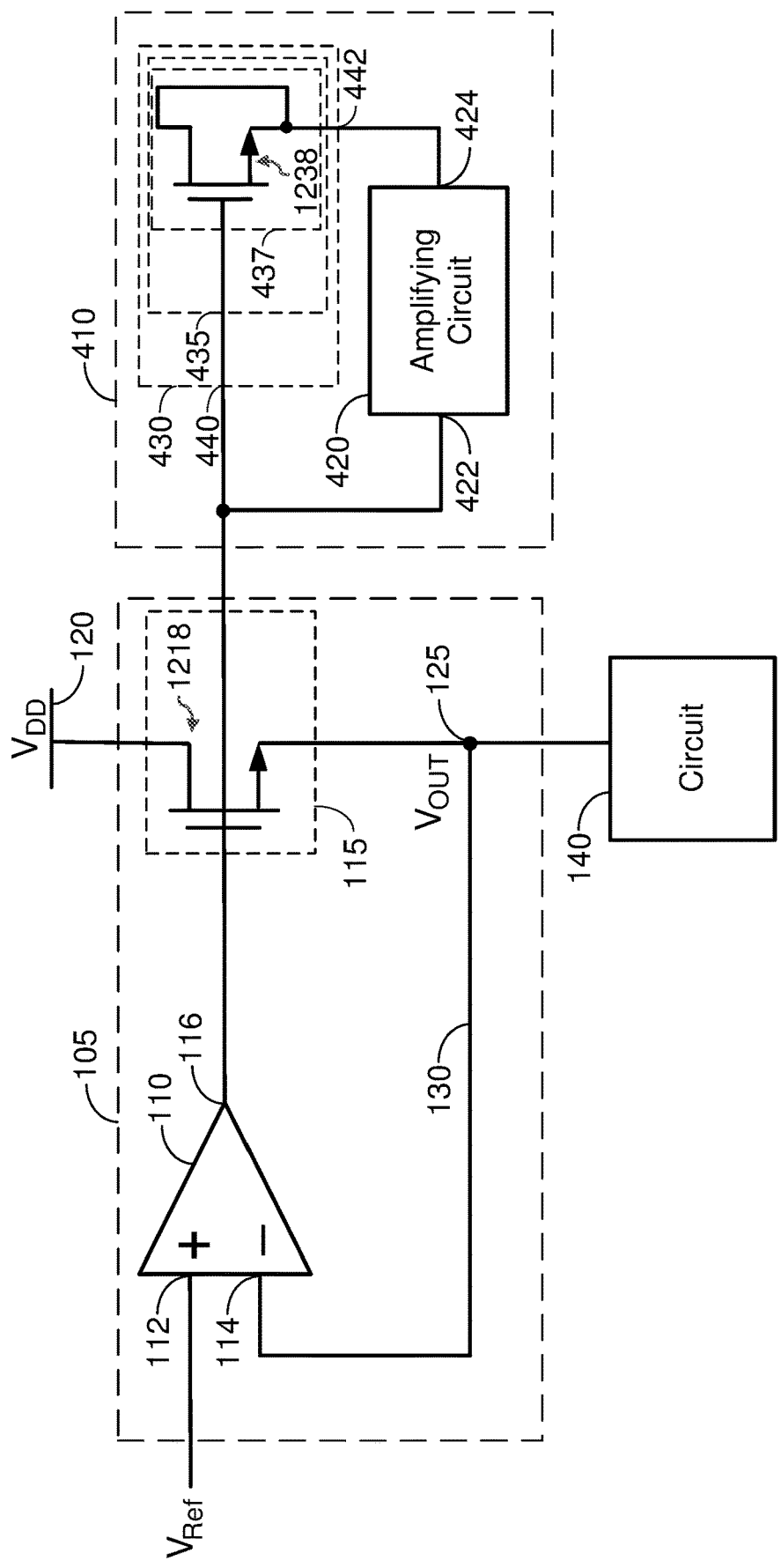
FIG. 12 shows another example of an LDO regulator and a PSR enhancer according to certain aspects of the present disclosure.

Although aspects of the present disclosure are described above using the example in which the pass transistor 115 is implemented the PMOS transistor 118, it is to be appreciated that the present disclosure is not limited to this example and that the pass transistor 115 may be implemented with another type of transistor. In this regard, FIG. 12 shows an example in which the pass transistor 115 is implemented with an n-type metal oxide semiconductor (NMOS) transistor 1218. In this example, the NMOS transistor 1218 has a drain coupled to the supply rail 120, a gate coupled to the output 116 of the amplifier 110, and a source coupled to the output 125 of the LDO regulator 105. Note that the first input 112 of the amplifier 110 is a non-inverting input and the second input 114 of the amplifier 110 is an inverting input in this example since the pass transistor 115 is implemented with the NMOS transistor 1218 in this example. In operation, the amplifier 110 adjusts the gate voltage of the pass transistor 115 in a direction that reduces the difference (i.e., error) between the reference voltage $V_{REF}$ and the regulated voltage $V_{OUT}$.

In this example, the MOS transistor 437 is implemented with an NMOS transistor 1238, in which the gate of the NMOS transistor 1238 is coupled to the gate of the pass transistor 115, and the source and the drain of the NMOS transistor 1238 are coupled together. In this example, the gate of the NMOS transistor 1238 is coupled to the first terminal 440 of the capacitor 430, and the source and the drain of the NMOS transistor 1238 are coupled to the second terminal 442 of the capacitor 430. As discussed above, the capacitor 430 is coupled between the input 422 of the amplifying circuit 420 and the output 424 of the amplifying circuit 420 to generate a negative capacitance (e.g., based on equation (4)) to cancel out the capacitive coupling effect and improve PSR performance. It is to be appreciated that the NMOS transistor 1238 may be used in place of the PMOS transistor 438 in any of the exemplary implementations of the PSR enhancer 410 shown in FIGS. 4 to 11.

Thus, in the example in FIG. 4, the pass transistor 115 is implemented with PMOS transistor 118 and the MOS transistor 437 is implemented with PMOS transistor 438, and, in the example in FIG. 12, the pass transistor 115 is implemented with NMOS transistor 1218 and the MOS transistor 437 is implemented with NMOS transistor 1238. However, it is to be appreciated that the present disclosure is not limited to these examples. In general, the pass transistor 115 and the MOS transistor 437 may be of the same transistor type. In other implementations, the MOS transistor 437 may be implemented with a different type of transistor than the pass transistor 115.

Figure 13:
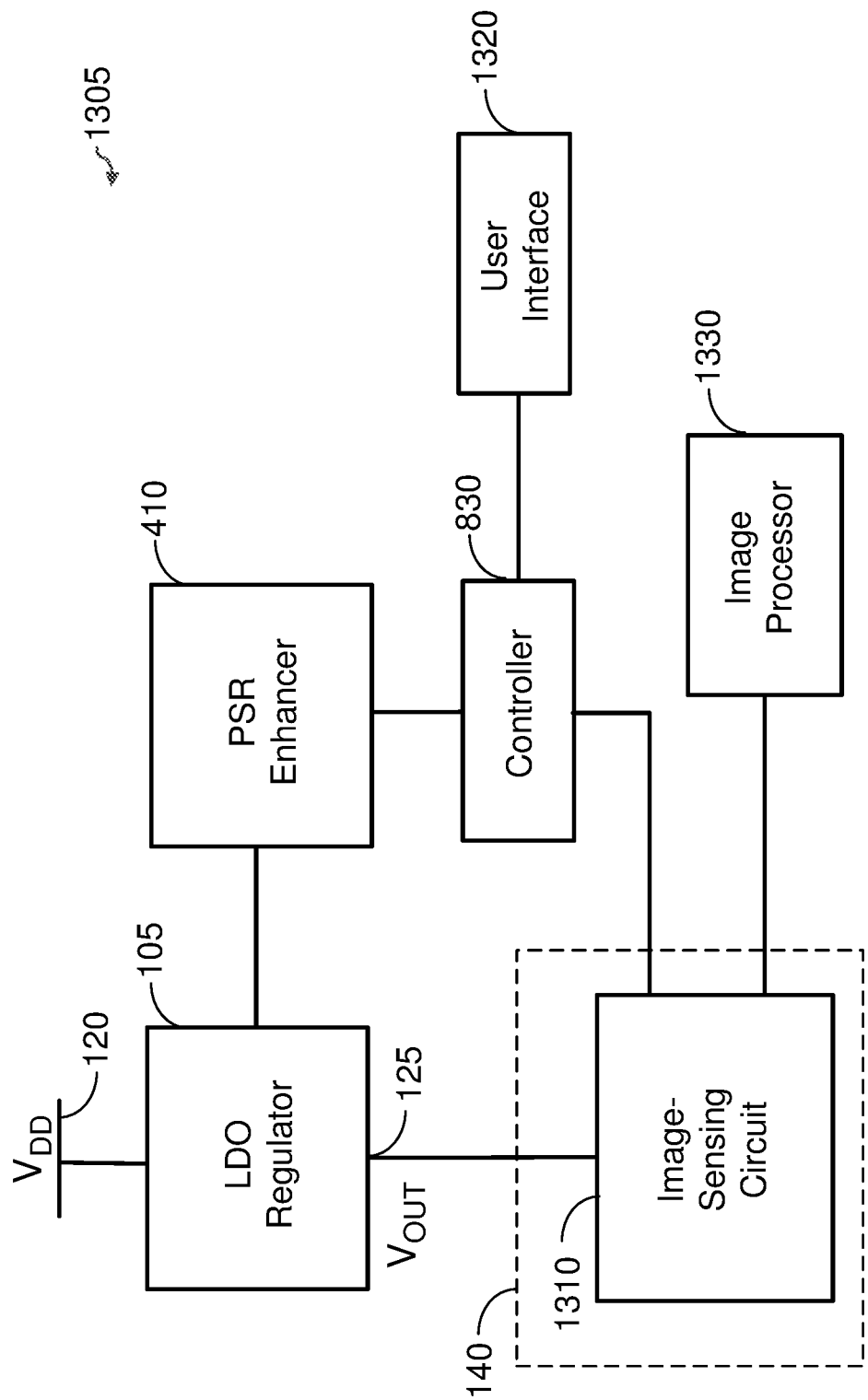
FIG. 13 shows an example of a system in which aspects of the present disclosure may be used.

FIG. 13 shows an example of a system 1305 in which aspects of the present disclosure may be used. However, it is to be appreciated that the present disclosure is not limited to the exemplary system 1305 shown in FIG. 13, and that the present disclosure may be used in other types of systems where high PSR is desirable.

In this example, the system 1305 includes the LDO regulator 105, the PSR enhancer 410, and the controller 830 discussed above. For ease of illustration, details of the LDO regulator 105 and the PSR enhancer 410 are not shown in FIG. 13. In this example, the circuit 140 includes an image-sensing circuit 1310 configured to capture an image. In this regard, the image-sensing circuit 1310 may include an array of image sensors (e.g., complementary-metal-oxide-semiconductor (CMOS) sensors, charge-coupled device (CCD) sensors, or another type of image sensors).

The system 1305 also includes a user interface 1320 coupled to the controller 830 and an image processor 1330 coupled to the image-sensing circuit 1310. The user interface 1320 is configured to receive an input from the user to capture an image. The user interface 1320 may include a graphical user interface, a button (e.g., shutter button), and/or another type of user interface. The image processor 1330 is configured to receive image data of an image captured by the image-sensing circuit 1310 and process the image data (e.g., perform color correction, noise reduction, etc.). The image processor 1330 may output the processed image to another processor or to a memory for storage.

In operation, the controller 830 may disable the PSR enhancer 410 before the user interface 1320 receives an input from the user to capture an image. To disable the PSR enhancer 410, the controller 830 may turn off the first switch 810 and the third switch 820, and turn on the second switch 815 shown in FIG. 8. The controller 830 may also turn off the first switch 1110 and turn on the second switch 1120 and the third switch 1130 shown in FIG. 11.

When the user interface 1320 receives an input from the user to capture an image, the controller 830 activates the image-sensing circuit 1310 to capture an image in response to the user input. The controller 830 also enables the PSR enhancer 410 in response to the user input. More particularly, the controller 830 enables the PSR enhancer 410 during a short delay between the time the user input is received and the image-sensing circuit 1310 captures the image so that the PSR enhancer 410 is enabled during the image capture. To enable the PSR enhancer 410, the controller 830 may turn on the first switch 810 and the third switch 820, and turn off the second switch 815 shown in FIG. 8. The controller 830 may also turn on the first switch 1110 and turn off the second switch 1120 and the third switch 1130 shown in FIG. 11. After the image is captured, the controller 830 may disable the PSR enhancer 410 to conserve power. Thus, in this example, the controller 830 enables the PSR enhancer 410 right before image capture to provide enhanced PSR during image capture. As discussed above, the image-sensing circuit 1310 outputs the image data for the captured image to the image processor 1330 for image processing.

Figure 14:
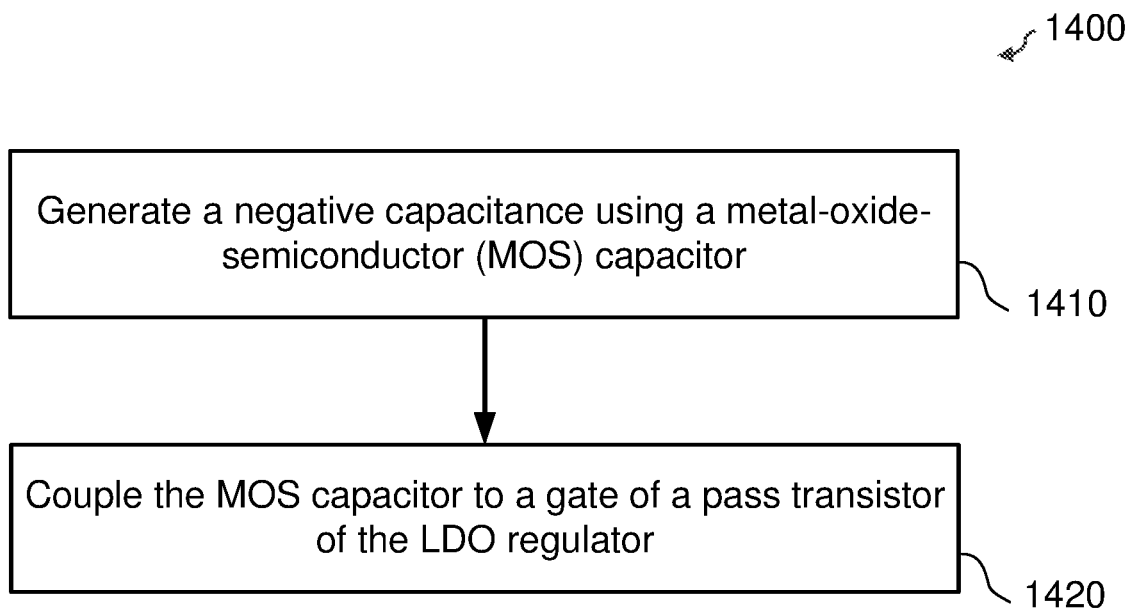
FIG. 14 is a flowchart illustrating an example of a method for enhancing power supply rejection according to certain aspects of the present disclosure.

FIG. 14 shows a flowchart of an exemplary method 1400 for enhancing power supply rejection for a low dropout (LDO) regulator according to certain aspects. The method 1400 may be performed by the PSR enhancer 410.

At block 1410, a negative capacitance is generated using a metal-oxide-semiconductor (MOS) capacitor. For example, the MOS capacitor may correspond to MOS capacitor 435. In one example, the MOS capacitor includes a metal-oxide-semiconductor (MOS) transistor (e.g., MOS transistor 437). The negative capacitance may be generated by the amplifying circuit 420 where the MOS capacitor is coupled between the output 424 of the amplifying circuit 420 and the input 422 of the amplifying circuit 420. The input 422 of the amplifying circuit 420 may be a non-inverting input.

At block 1420, the negative capacitance is coupled to a gate of a pass transistor of the LDO regulator. For example, the pass transistor may correspond to the pass transistor 115 of the LDO regulator 105. For the example where the MOS capacitor includes a MOS transistor, coupling the negative capacitor to the gate of the pass transistor may include coupling a gate of the MOS transistor to the gate of the pass transistor.

The controller 830 may be implemented with a processor, a state machine, an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
    an amplifying circuit having an input and an output, wherein the input of the amplifying circuit is coupled to a gate of a pass transistor of a low dropout (LDO) regulator; and
    a metal-oxide-semiconductor (MOS) capacitor coupled between the output of the amplifying circuit and the input of the amplifying circuit.
2. The system of clause 1, wherein the MOS capacitor comprises a metal-oxide-semiconductor (MOS) transistor having a gate coupled to the input of the amplifying circuit, and a drain and a source coupled to the output of the amplifying circuit.
3. The system of clause 2, wherein the pass transistor and the MOS transistor are of a same transistor type.
4. The system of clause 2 or 3, wherein the pass transistor comprises a first p-type metal-oxide-semiconductor (PMOS) transistor and the MOS transistor comprises a second PMOS transistor.
5. The system of clause 2 or 3, wherein the pass transistor comprises a first n-type metal-oxide-semiconductor (NMOS) transistor and the MOS transistor comprises a second NMOS transistor.
6. The system of any one of clauses 2 to 5, wherein the MOS transistor is proportional to the pass transistor.
7. The system of any one of clauses 2 to 6, wherein a size of the pass transistor is a multiple of a size of the MOS transistor.
8. The system of any one of clauses 2 to 7, wherein a gate width or a gate area of the pass transistor is a multiple of a gate width or a gate area of the MOS transistor.
9. The system of any one of clauses 1 to 8, further comprising a current-sensing transistor having a gate coupled to the gate of the pass transistor, and a drain coupled to the amplifying circuit.
10. The system of clause 9, wherein the pass transistor and the current-sensing transistor are of a same transistor type.
11. The system of clause 9 or 10, wherein the pass transistor comprises a first p-type metal-oxide-semiconductor (PMOS) transistor and the current-sensing transistor comprises a second PMOS transistor.
12. The system of any one of clauses 1 to 11, further comprising a first switch coupled between the input of the amplifying circuit and the gate of the pass transistor.
13. The system of clause 12, further comprising a second switch coupled between the input of the amplifying circuit and a ground.
14. The system of any one of clauses 1 to 13, further comprising a high-pass filter coupled between the gate of the pass transistor and the input of the amplifying circuit.
15. The system of clause 14, wherein the high-pass filter comprises:
    a capacitor coupled between the gate of the pass transistor and the input of the amplifying circuit; and
    a resistor coupled to the input of the amplifying circuit.
16. The system of clause 15, wherein the resistor is coupled between the input of the amplifying circuit and an output of the LDO regulator.
17. The system of any one of clauses 1 to 16, wherein the amplifying circuit comprises:
    an amplifier having a first input, a second input, and an output, wherein the output of the amplifier is coupled to the output of the amplifying circuit and the first input of the amplifier is coupled to the input of the amplifying circuit;
    a first resistor coupled to the second input of the amplifier; and
    a second resistor coupled between the output of the amplifier and the second input of the amplifier.
18. The system of clause 17, wherein the first resistor is coupled between the second input of the amplifier and an output of the LDO regulator.
19. The system of clause 17 or 18, wherein the amplifier comprises:
    a first input transistor having a gate coupled to the first input of the amplifier;
    a second input transistor having a gate coupled to the second input of the amplifier;
    a load circuit coupled to a drain of the first input transistor, a drain of the second input transistor, and the output of the amplifier; and
    a current mirror coupled to a source of the first input transistor and a source of the second input transistor.
20. The system of clause 19, further comprising a current-sensing transistor having a gate coupled to the gate of the pass transistor, and a drain coupled to the current mirror.
21. The system of clause 20, wherein a first terminal of the current mirror is coupled to the drain of the current-sensing transistor, and a second terminal of the current mirror is coupled to the source of the first input transistor and the source of the second input transistor.
22. The system of clause 21, wherein the current mirror is configured to mirror a current flowing into the first terminal of the current mirror at the second terminal of the current mirror.
23. The system of any one of clauses 19 to 22, wherein the amplifier further comprises a voltage buffer circuit coupled between the load circuit and the output of the amplifier.
24. A method for enhancing power supply rejection for a low dropout (LDO) regulator, comprising:
    generating a negative capacitance using a metal-oxide-semiconductor (MOS) capacitor; and
    coupling the negative capacitance to a gate of a pass transistor of the LDO regulator.
25. The method of clause 24, wherein generating the negative capacitance comprises coupling the MOS capacitor between an output of an amplifying circuit and an input of the amplifying circuit.
26. The method of clause 24 or 25, wherein the MOS capacitor comprises a metal-oxide-semiconductor (MOS) transistor.
27. The method of clause 26, wherein a drain and a source of the MOS transistor are coupled together.
28. The method of clause 26 or 27, wherein coupling the negative capacitance to the gate of the pass transistor of the LDO regulator comprises coupling a gate of the MOS transistor to the gate of the pass transistor.
29. The method of any one of clauses 26 to 28, wherein the pass transistor and the MOS transistor are of a same transistor type.
30. The method of any one of clauses 26 to 29, wherein the pass transistor comprises a first p-type metal-oxide-semiconductor (PMOS) transistor and the MOS transistor comprises a second PMOS transistor.
31. The method of any one of clauses 26 to 29, wherein the pass transistor comprises a first n-type metal-oxidesemiconductor (NMOS) transistor and the MOS transistor comprises a second NMOS transistor.

32. A system, comprising:
    a low dropout (LDO) regulator, wherein the LDO regulator comprises:
    a pass transistor coupled between a supply rail and an output of the LDO regulator; and
    an amplifier having a first input configured to receive a reference voltage, a second input coupled to the output of the LDO regulator via a feedback path, and an output coupled to a gate of the pass transistor;
    an amplifying circuit having an input and an output, wherein the input of the amplifying circuit is coupled to the gate of the pass transistor; and
    a metal-oxide-semiconductor (MOS) capacitor coupled between the output of the amplifying circuit and the input of the amplifying circuit.

33. The system of clause 32, wherein the MOS capacitor comprises a metal-oxide-semiconductor (MOS) transistor having a gate coupled to the input of the amplifying circuit, and a drain and a source coupled to the output of the amplifying circuit.

34. The system of clause 33, wherein the pass transistor comprises a first p-type metal-oxide-semiconductor (PMOS) transistor and the MOS transistor comprises a second PMOS transistor.

35. The system of clause 34, wherein a source of the pass transistor is coupled to the supply rail and a drain of the pass transistor is coupled to the output of the LDO regulator.

36. The system of clause 33, wherein the pass transistor comprises a first n-type metal-oxide-semiconductor (NMOS) transistor and the MOS transistor comprises a second NMOS transistor.

37. The system of clause 36, wherein a drain of the pass transistor is coupled to the supply rail and a source of the pass transistor is coupled to the output of the LDO regulator.

38. The system of any one of clauses 33 to 37, wherein the MOS transistor is proportional to the pass transistor.

39. The system of any one of clauses 33 to 38, wherein a size of the pass transistor is a multiple of a size of the MOS transistor.

40. The system of any one of clauses 33 to 39, wherein a gate width or a gate area of the pass transistor is a multiple of a gate width or a gate area of the MOS transistor.

41. The system of any one of clauses 32 to 40, further comprising a current-sensing transistor having a gate coupled to the gate of the pass transistor, and a drain coupled to the amplifying circuit.

42. The system of clause 41, wherein the pass transistor and the current-sensing transistor are of a same transistor type.

43. The system of clause 41 or 42, wherein the pass transistor comprises a first p-type metal-oxide-semiconductor (PMOS) transistor and the current-sensing transistor comprises a second PMOS transistor.

44. The system of any one of clauses 32 to 43, further comprising a first switch coupled between the input of the amplifying circuit and the gate of the pass transistor.

45. The system of clause 44, further comprising a second switch coupled between the input of the amplifying circuit and a ground.

46. The system of any one of clauses 32 to 45, further comprising a high-pass filter coupled between the gate of the pass transistor and the input of the amplifying circuit.

47. The system of clause 46, wherein the high-pass filter comprises:
    a capacitor coupled between the gate of the pass transistor and the input of the amplifying circuit; and
    a resistor coupled to the input of the amplifying circuit.

48. The system of clause 47, wherein the resistor is coupled between the input of the amplifying circuit and the output of the LDO regulator.

49. The system of any one of clauses 32 to 48, wherein the amplifying circuit comprises:
    an amplifier having a first input, a second input, and an output, wherein the output of the amplifier is coupled to the output of the amplifying circuit and the first input of the amplifier is coupled to the input of the amplifying circuit;
    a first resistor coupled to the second input of the amplifier; and
    a second resistor coupled between the output of the amplifier and the second input of the amplifier.

50. The system of clause 49, wherein the first resistor is coupled between the second input of the amplifier and the output of the LDO regulator.

51. The system of clause 49 or 50, wherein the amplifier comprises:
    a first input transistor having a gate coupled to the first input of the amplifier;
    a second input transistor having a gate coupled to the second input of the amplifier;
    a load circuit coupled to a drain of the first input transistor, a drain of the second input transistor, and the output of the amplifier; and
    a current mirror coupled to a source of the first input transistor and a source the second input transistor.

52. The system of clause 51, further comprising a current-sensing transistor having a gate coupled to the gate of the pass transistor, and a drain coupled to the current mirror.

53. The system of clause 52, wherein a first terminal of the current mirror is coupled to the drain of the current-sensing transistor, and a second terminal of the current mirror is coupled to the source of the first input transistor and the source of the second input transistor.

54. The system of clause 53, wherein the current mirror is configured to mirror a current flowing into the first terminal of the current mirror at the second terminal of the current mirror.

55. The system of any one of clauses 51 to 54, wherein the amplifier further comprises a voltage buffer circuit coupled between the load circuit and the output of the amplifier.

It is to be appreciated that the present disclosure is not limited to the exemplary terminology used above to describe aspects of the present disclosure.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   an amplifying circuit having an input and an output;
   a high-pass filter coupled between a gate of a pass transistor of a low dropout (LDO) regulator and the input of the amplifying circuit, wherein the high-pass filter comprises
      a capacitor coupled between the gate of the pass transistor and the input of the amplifying circuit, and
      a resistor coupled to the input of the amplifying circuit, wherein the resistor is coupled between the input of the amplifying circuit and a drain of the pass transistor; and
   a metal-oxide-semiconductor (MOS) capacitor coupled between the output of the amplifying circuit and the gate of the pass transistor.

2. The system of claim 1, wherein the input of the amplifying circuit is coupled between the capacitor and the resistor.

3. The system of claim 1, wherein the resistor is coupled between the input of the amplifying circuit and an output of the LDO regulator.

4. The system of claim 3, wherein the input of the amplifying circuit is coupled between the capacitor and the resistor.

5. The system of claim 1, wherein the MOS capacitor comprises a metal-oxide-semiconductor (MOS) transistor having a gate coupled to the input of the amplifying circuit, and a drain and a source coupled to the output of the amplifying circuit.

6. The system of claim 5, wherein the pass transistor and the MOS transistor are of a same transistor type.

7. The system of claim 5, wherein the pass transistor comprises a first p-type metal-oxide-semiconductor (PMOS) transistor and the MOS transistor comprises a second PMOS transistor.

8. The system of claim 5, wherein the pass transistor comprises a first n-type metal-oxide-semiconductor (NMOS) transistor and the MOS transistor comprises a second NMOS transistor.

9. The system of claim 5, wherein a gate width or a gate area of the pass transistor is a multiple of a gate width or a gate area of the MOS transistor.

10. The system of claim 1, wherein the amplifying circuit comprises:
    an amplifier having a first input, a second input, and an output, wherein the output of the amplifier is coupled to the output of the amplifying circuit and the first input of the amplifier is coupled to the input of the amplifying circuit;
    a first resistor coupled to the second input of the amplifier; and
    a second resistor coupled between the output of the amplifier and the second input of the amplifier.

11. The system of claim 10, wherein the high-pass filter comprises:
    a capacitor coupled between the gate of the pass transistor and the input of the amplifying circuit; and
    a third resistor coupled to the input of the amplifying circuit.

12. The system of claim 11, wherein the third resistor is coupled between the input of the amplifying circuit and an output of the LDO regulator.

13. The system of claim 12, wherein the input of the amplifying circuit is coupled between the capacitor and the third resistor.

14. The system of claim 11, wherein the first resistor is coupled between the second input of the amplifier and an output of the LDO regulator.

15. A system, comprising:
    an amplifying circuit having an input and an output, wherein the input of the amplifying circuit is coupled to a gate of a pass transistor of a low dropout (LDO) regulator, a source of the pass transistor is coupled to a supply rail, and a drain of the pass transistor is coupled to an output of the LDO regulator, wherein the amplifying circuit comprises
       an amplifier having a first input, a second input, and an output, wherein the output of the amplifier is coupled to the output of the amplifying circuit and the first input of the amplifier is coupled to the input of the amplifying circuit,
       a first resistor coupled between the second input of the amplifier and the output of the LDO regulator, and
       a second resistor coupled between the output of the amplifier and the second input of the amplifier;
    a metal-oxide-semiconductor (MOS) capacitor coupled between the output of the amplifying circuit and the gate of the pass transistor; and
    a current-sensing transistor having a gate coupled to the gate of the pass transistor, a source coupled to the supply rail, and a drain coupled to the amplifying circuit.

16. The system of claim 15, wherein the pass transistor comprises a first p-type metal-oxide-semiconductor (PMOS) transistor and the current-sensing transistor comprises a second PMOS transistor.

17. The system of claim 15, wherein the MOS capacitor comprises a metal-oxide-semiconductor (MOS) transistor having a gate coupled to the input of the amplifying circuit, and a drain and a source coupled to the output of the amplifying circuit.

18. The system of claim 15, wherein the current-sensing transistors provides the amplifying circuit with a bias current for biasing the amplifying circuit.

19. The system of claim 15, wherein the amplifier comprises:
    a first input transistor having a gate coupled to the first input of the amplifier;
    a second input transistor having a gate coupled to the second input of the amplifier;
    a load circuit coupled to a drain of the first input transistor, a drain of the second input transistor, and the output of the amplifier; and a current mirror coupled to a source of the first input transistor, a source of the second input transistor, and the drain of the current-sensing transistor.

20. The system of claim 19, wherein a first terminal of the current mirror is coupled to the drain of the current-sensing transistor, and a second terminal of the current mirror is coupled to the source of the first input transistor and the source of the second input transistor.

21. The system of claim 20, wherein the current mirror is configured to mirror a current flowing into the first terminal of the current mirror at the second terminal of the current mirror.

* * * * *